(12) United States Patent
Kawano et al.

(10) Patent No.: US 11,942,489 B2
(45) Date of Patent: Mar. 26, 2024

(54) IMAGE READING DEVICE

(71) Applicant: Mitsubishi Electric Corporation, Tokyo (JP)

(72) Inventors: Hiroyuki Kawano, Tokyo (JP); Naoki Nakagawa, Tokyo (JP); Takeshi Ono, Tokyo (JP); Shigeru Takushima, Tokyo (JP); Taisuke Makita, Tokyo (JP); Naoyuki Tokida, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 238 days.

(21) Appl. No.: 17/634,244

(22) PCT Filed: Sep. 5, 2019

(86) PCT No.: PCT/JP2019/034944
§ 371 (c)(1),
(2) Date: Feb. 10, 2022

(87) PCT Pub. No.: WO2021/044573
PCT Pub. Date: Mar. 11, 2021

(65) Prior Publication Data
US 2022/0328540 A1 Oct. 13, 2022

(51) Int. Cl.
*H04N 1/03* (2006.01)
*H01L 27/146* (2006.01)
(Continued)

(52) U.S. Cl.
CPC .. *H01L 27/14605* (2013.01); *H01L 27/14627* (2013.01); *H04N 1/0306* (2013.01);
(Continued)

(58) Field of Classification Search
CPC ..... H04N 1/1917; H04N 1/192; H04N 1/0318
See application file for complete search history.

(56) References Cited

U.S. PATENT DOCUMENTS 8,228,566 B2 * 7/2012 Kawano ............ H04N 1/19584
358/475
10,069,997 B2 * 9/2018 Murase ................ H04N 1/1903
(Continued)

FOREIGN PATENT DOCUMENTS

JP 63-156473 A 6/1988
JP 63156473 A * 6/1988
(Continued)

OTHER PUBLICATIONS

International Search Report and Written Opinion dated Oct. 29, 2019, received for PCT Application PCT/JP2019/034944, Filed on Sep. 5, 2019, 11 pages including English Translation.
(Continued)

*Primary Examiner* — Ted W Barnes
(74) *Attorney, Agent, or Firm* — XSENSUS LLP

(57) ABSTRACT

An image reading device includes a plurality of light-receiving pixels configured to receive reflected light; a first light-shielding member including a plurality of first openings and disposed between the plurality of light-receiving pixels and a reference surface; a second light-shielding member including a plurality of second openings and disposed between the plurality of first openings and the reference surface; and a plurality of condenser lenses disposed at a distance from the plurality of second openings. The plurality of condenser lenses, the second light-shielding member, the first light-shielding member, and the plurality of light-receiving pixels are disposed at positions at which reflected light sequentially passes through one of the condenser lenses corresponding to each light-receiving pixel, one of the second openings corresponding to the each light-receiving pixel, and one of the first openings corresponding to the each light-receiving pixel and enters the each light-receiving pixel.

12 Claims, 28 Drawing Sheets

(51) Int. Cl.
*H04N 1/031* (2006.01)
*H04N 1/191* (2006.01)
*H04N 1/192* (2006.01)
*H04N 1/195* (2006.01)

(52) U.S. Cl.
CPC .......... *H04N 1/1917* (2013.01); *H04N 1/192* (2013.01); *H04N 1/19589* (2013.01); *H04N 1/0318* (2013.01)

(56) References Cited

U.S. PATENT DOCUMENTS

| | | | |
|---|---|---|---|
| 2009/0128671 A1* | 5/2009 | Kusaka | H04N 25/704 348/246 |
| 2010/0002307 A1* | 1/2010 | Yamamura | H04N 1/0311 359/619 |
| 2011/0216419 A1* | 9/2011 | Shiraishi | G02B 3/0062 359/622 |
| 2013/0155472 A1* | 6/2013 | Kawano | G03G 15/60 358/450 |
| 2014/0226202 A1* | 8/2014 | Sugita | H04N 1/02855 359/362 |
| 2014/0246570 A1* | 9/2014 | Minobe | H04N 1/0305 250/227.2 |
| 2015/0109676 A1* | 4/2015 | Kobayashi | H04N 1/031 359/619 |
| 2018/0013919 A1* | 1/2018 | Asamura | H04N 1/00034 |

FOREIGN PATENT DOCUMENTS

| | | | |
|---|---|---|---|
| JP | 2001-223846 A | | 8/2001 |
| JP | 2001223846 A | * | 8/2001 |
| JP | 2009-124573 A | | 6/2009 |
| JP | 2013-45096 A | | 3/2013 |
| JP | 2015-133658 A | | 7/2015 |
| JP | 2015133658 A | * | 7/2015 |
| JP | 5767907 B2 | * | 8/2015 |
| JP | 6124809 B2 | * | 5/2017 |

OTHER PUBLICATIONS

Kawano, "Lensless Image Scanner Using Multilayered Aperture Array for Noncontact Imaging", Optical Engineering, Oct. 2016, vol. 55, No. 10, 7 pages.

* cited by examiner

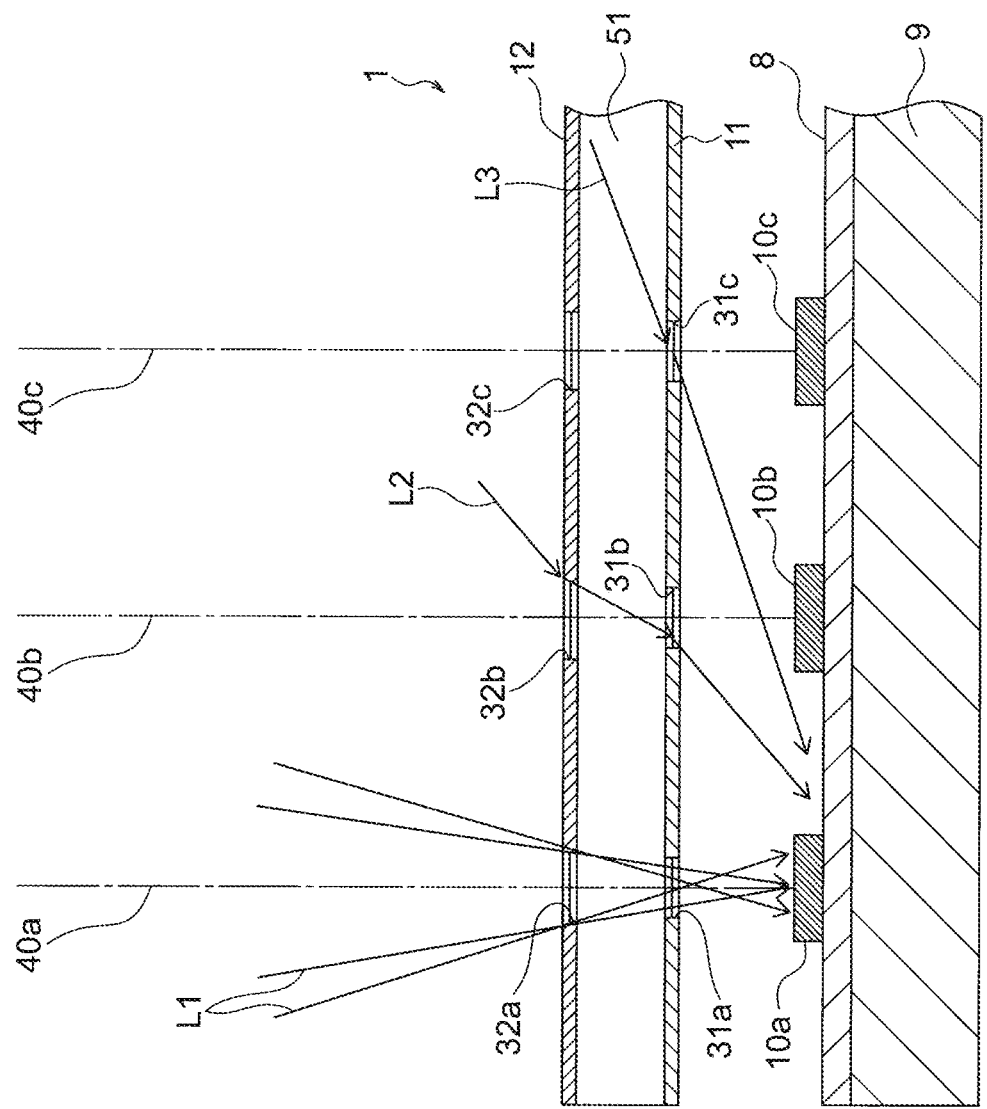

Comparative Example 1

Comparative Example 1

Comparative Example 1

Comparative Example 2

Comparative Example 2

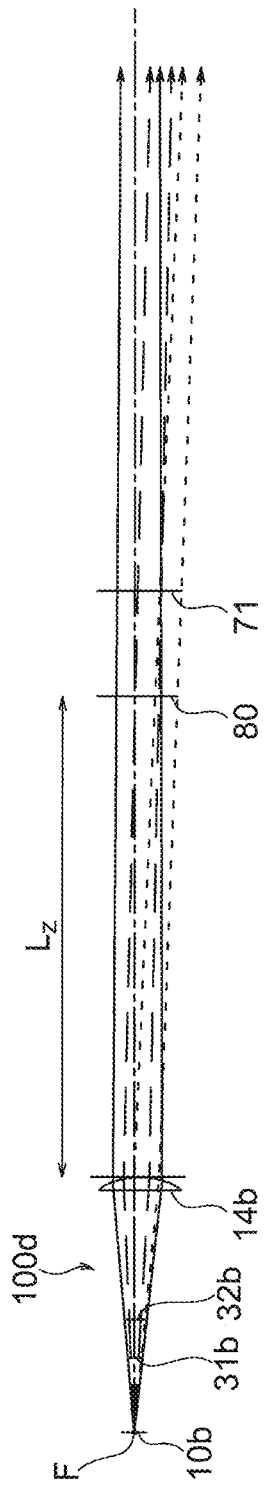
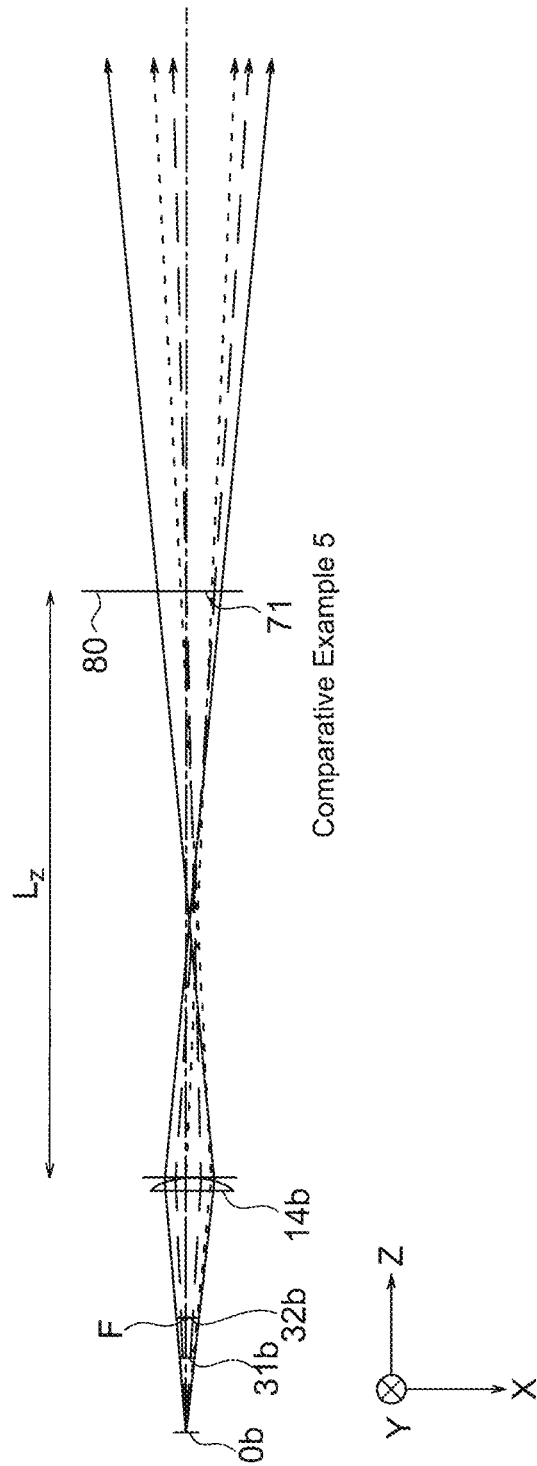

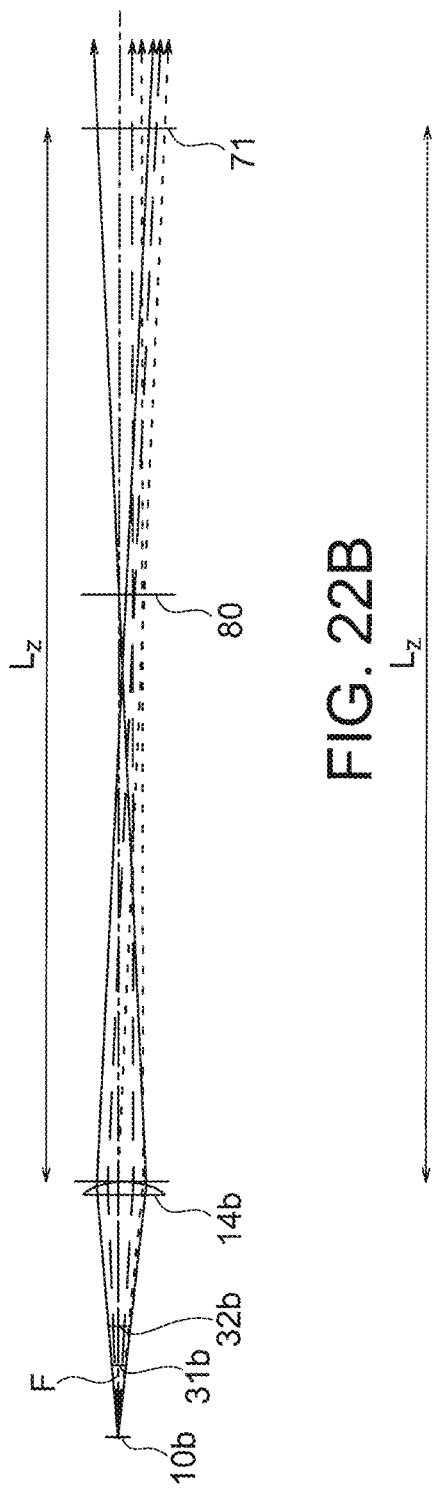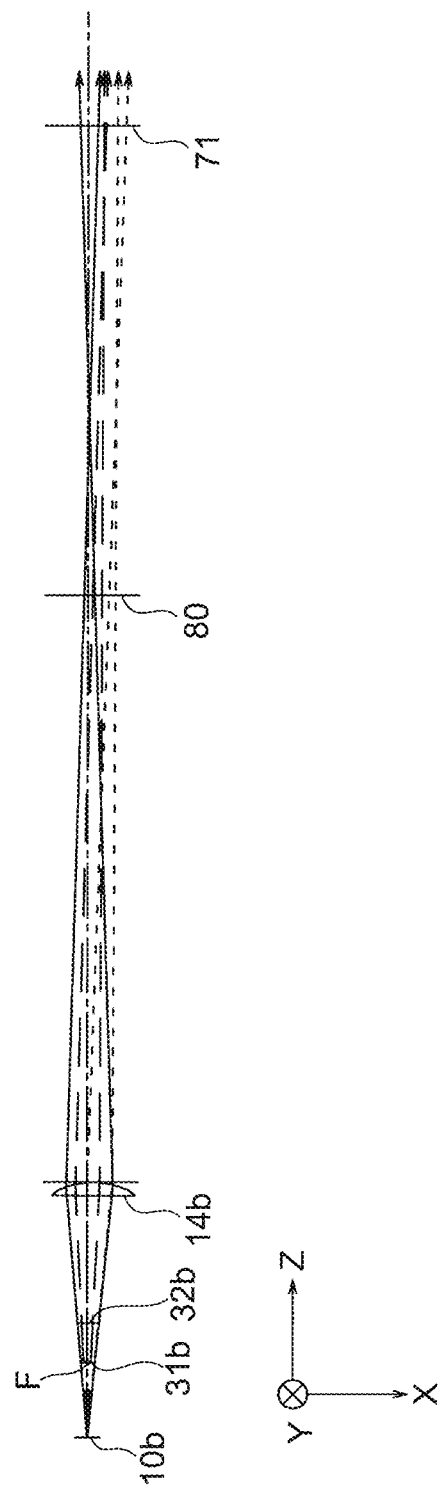

IMAGE READING DEVICE

CROSS-REFERENCE TO RELATED APPLICATION

The present application is based on PCT filing PCT/JP2019/034944, filed Sep. 5, 2019, the entire contents of which are incorporated herein by reference.

TECHNICAL FIELD

The present invention relates to an image reading device.

BACKGROUND ART

A proposed image reading device includes a light-shielding member having an opening through which reflected light reflected on an imaging object passes, and a plurality of light-receiving pixels (i.e., light-receiving devices) which reflected light that has passed through the opening enter. See, for example, Patent Reference 1.

PRIOR ART REFERENCE

Patent Reference

Patent Reference 1: Japanese Patent Application Publication No. 2015-133658

SUMMARY OF THE INVENTION

Problem to be Solved by the Invention

The image reading device described in Patent Reference 1, however, has a problem that the depth of field decreases as the opening is enlarged in order to increase the amount of light received by light-receiving pixels.

The present invention has been made to solve the foregoing problems, and has an object of providing an image reading device capable of increasing the depth of field while increasing the amount of light received by light-receiving pixels.

Means for Solving the Problem

An image reading device according to an aspect of the present invention includes a plurality of light-receiving pixels arranged in a predetermined arrangement direction and configured to receive light reflected on an imaging object, the imaging object being placed on a predetermined reference surface; a first light-shielding member including a plurality of first openings and disposed between the plurality of light-receiving pixels and the reference surface; a second light-shielding member including a plurality of second openings and disposed between the plurality of first openings and the reference surface; and a plurality of condenser lenses disposed between the plurality of second openings and the reference surface and disposed at a distance from the plurality of second openings, wherein the plurality of first openings are arranged to correspond to the plurality of light-receiving pixels respectively, the plurality of second openings are arranged to correspond to the plurality of light-receiving pixels respectively, the plurality of condenser lenses are arranged to correspond to the plurality of light-receiving pixels respectively, and the plurality of condenser lenses, the second light-shielding member, the first light-shielding member, and the plurality of light-receiving pixels are arranged at positions at which the reflected light entering each light-receiving pixel of the plurality of light-receiving pixels sequentially passes through one of the plurality of condenser lenses corresponding to the each light-receiving pixel, one of the plurality of second openings corresponding to the each light-receiving pixel, and one of the plurality of first openings corresponding to the each light-receiving pixel and enters the each light-receiving pixel.

Effect of the Invention

According to the present invention, it is possible to increase the depth of field while increasing the amount of light received by light-receiving pixels.

BRIEF DESCRIPTION OF THE DRAWINGS

FIG. 6 is a diagram showing a part of the configuration shown in FIG. 3, and reflected light passing through second openings and first openings.

3

Figure 16:
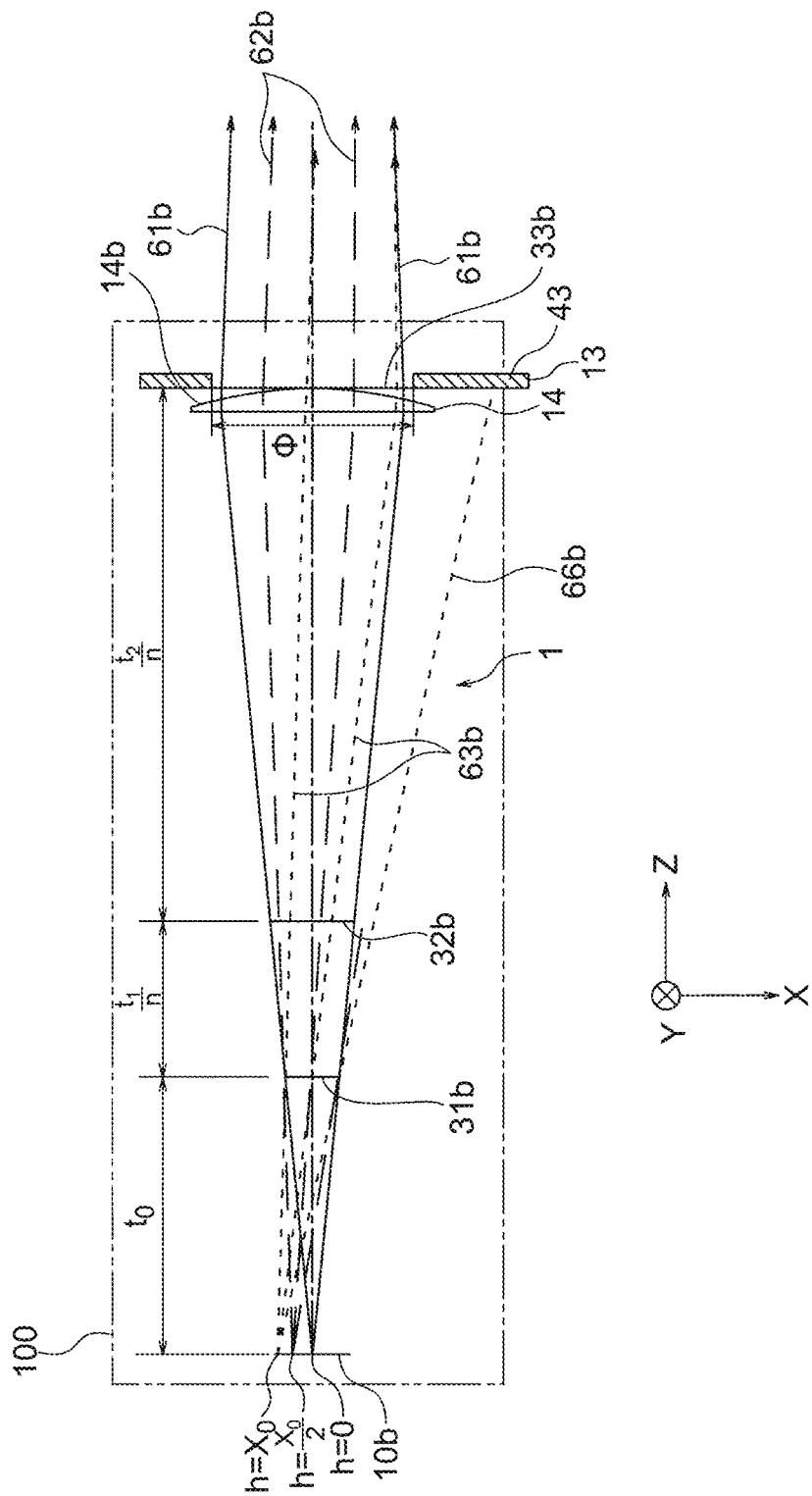
FIG. 16 is a diagram showing imaginary back light traveling from the light-receiving pixel in the +Z-axis direction, in the image reading device according to the first embodiment.
Figure 17:
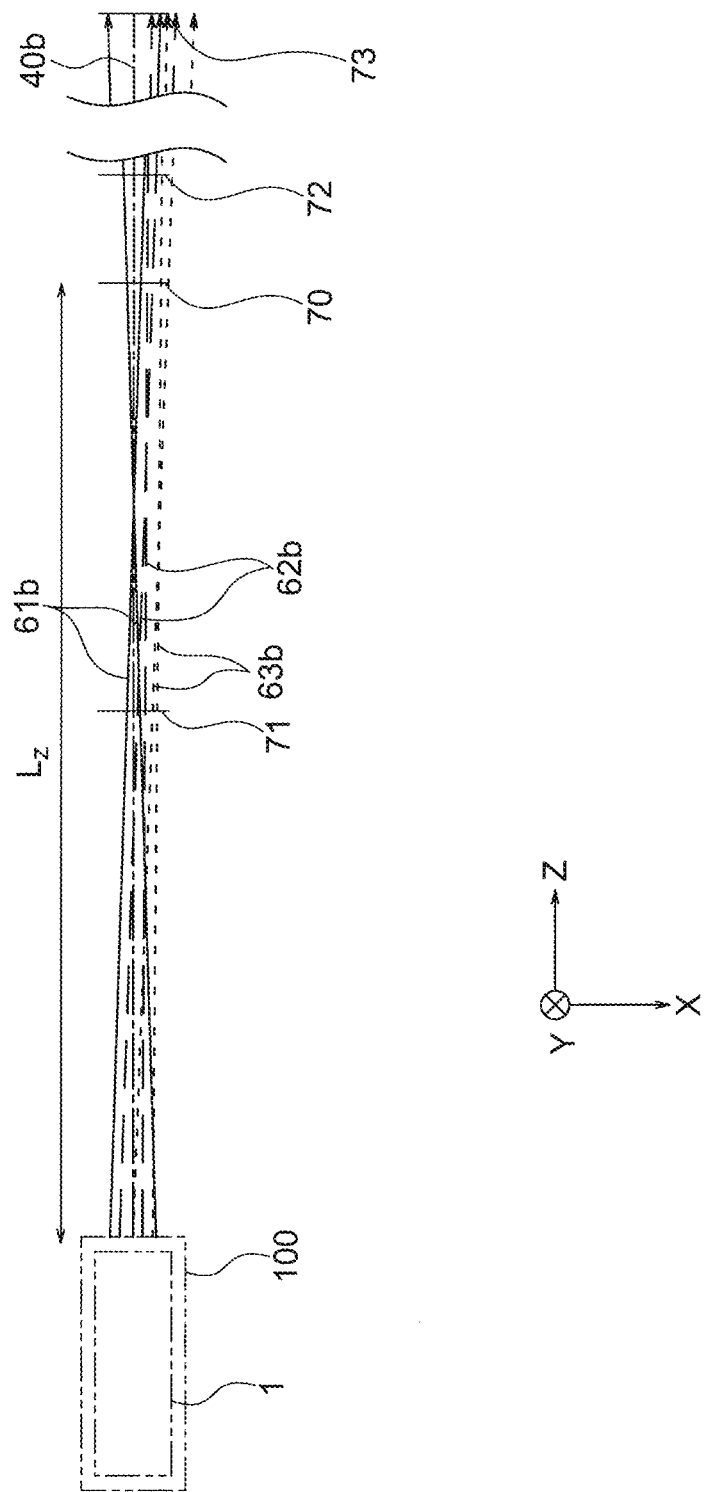

FIG. 17 is a diagram showing spread of the back light beams illustrated in FIG. 16.

Figure 18:
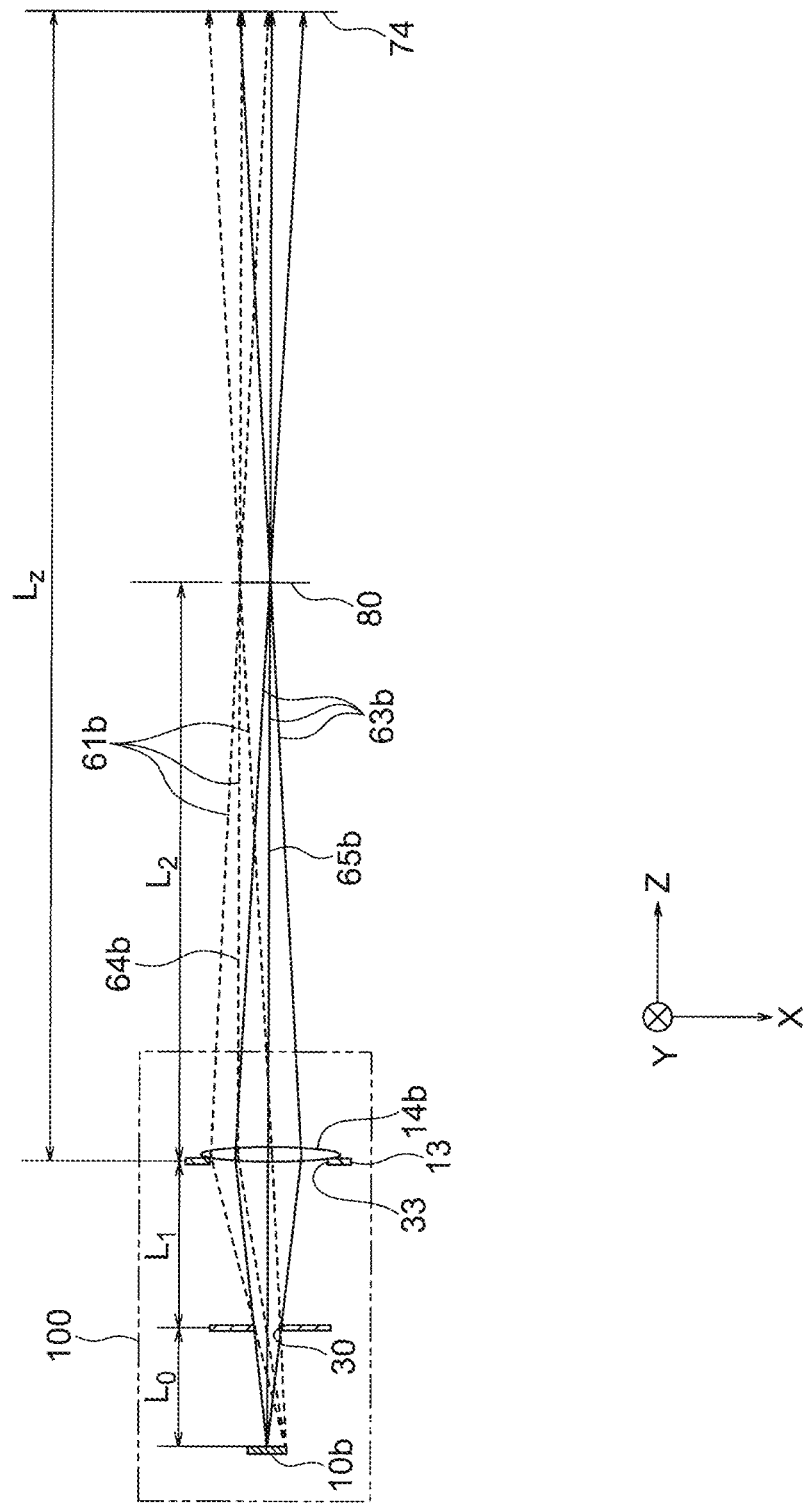

FIG. 18 is a diagram showing imaginary back light from the light-receiving pixel in the +Z-axis direction in the image reading device according to the first embodiment in a case where one of the first opening or the second opening is an aperture stop.

Figure 19:
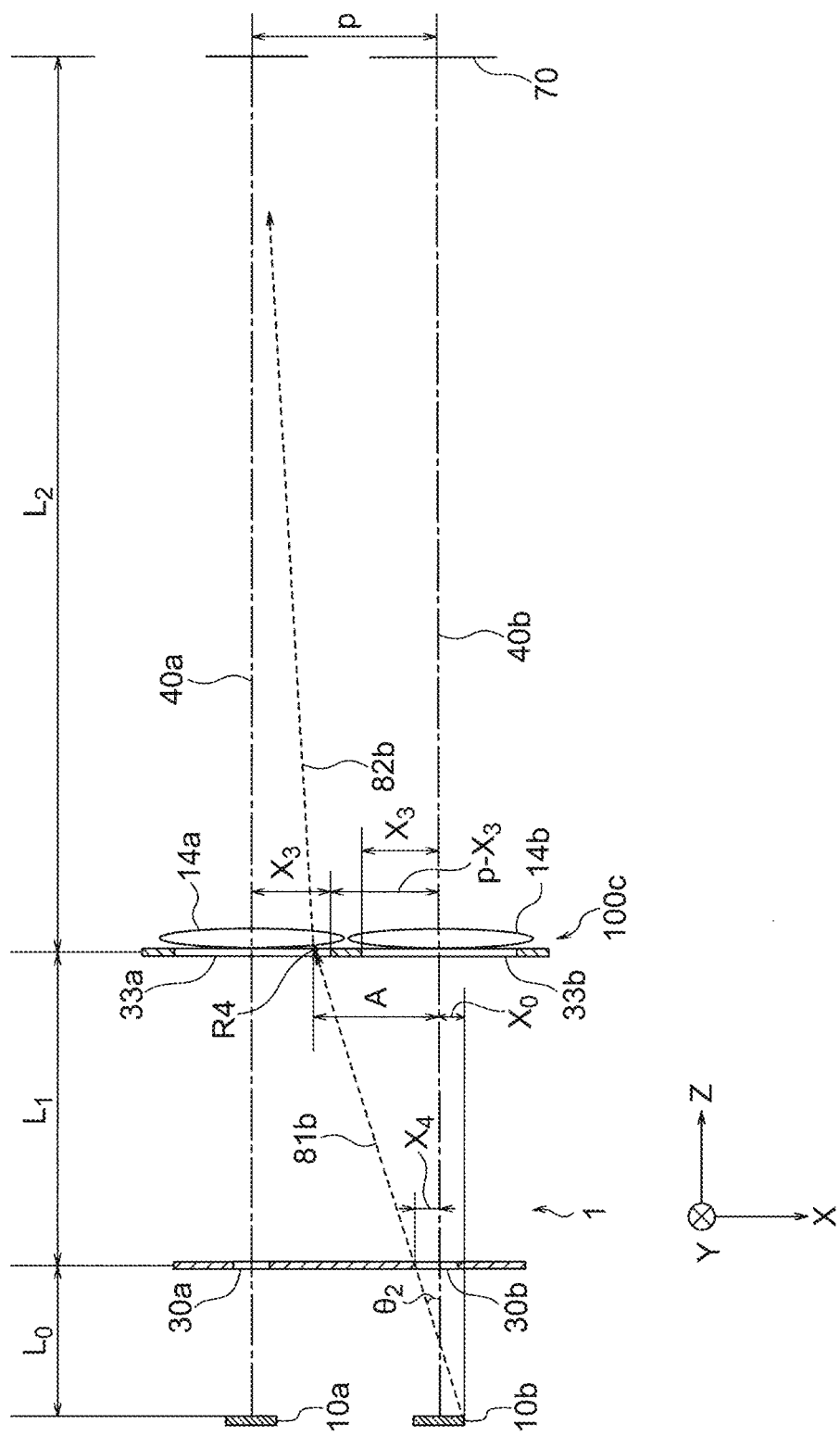

FIG. 19 is a diagram showing imaginary back light traveling from a light-receiving pixel in the +Z-axis direction, in an image reading device according to a third comparative example.

Figure 20:
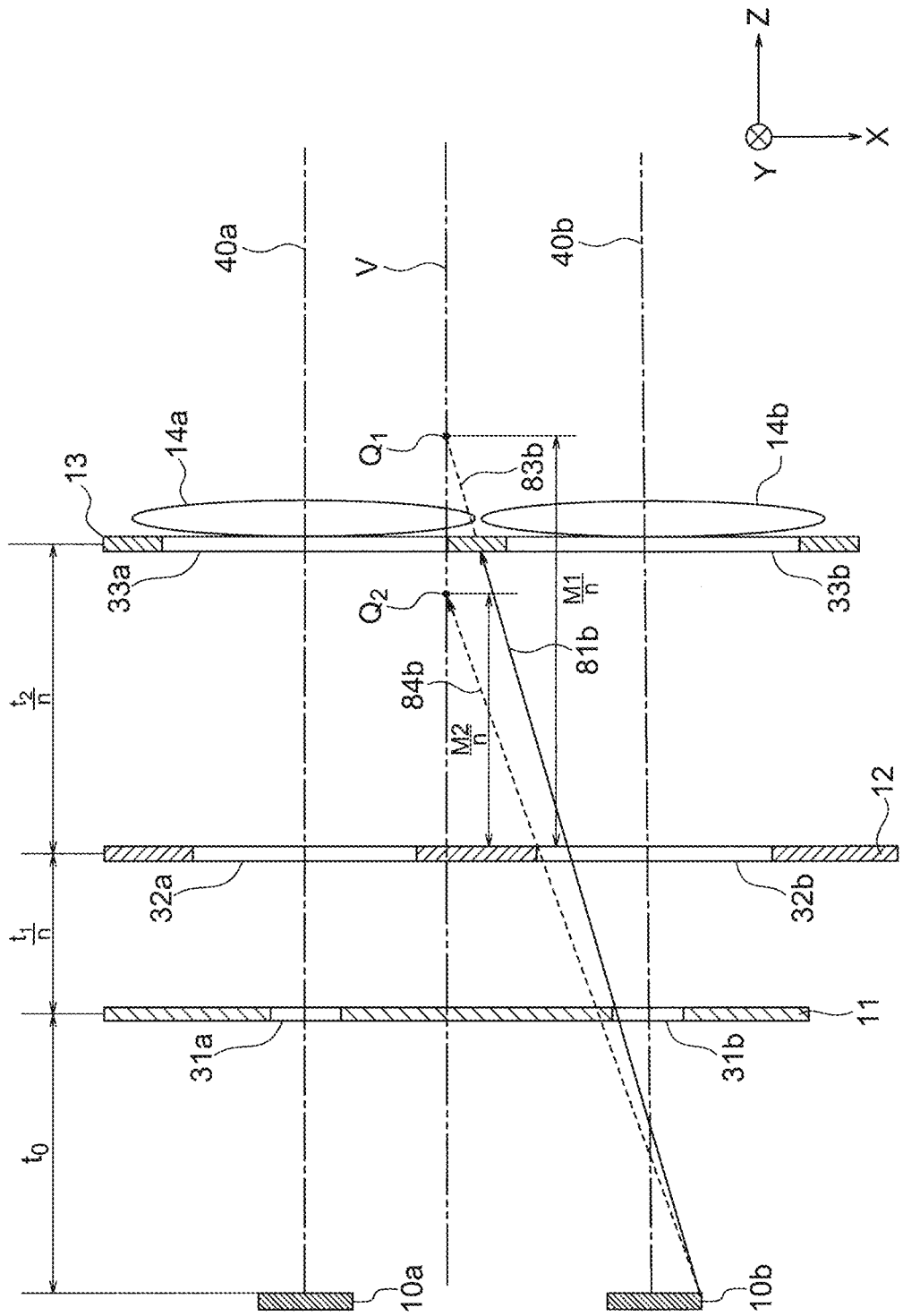

FIG. 20 is a diagram showing imaginary back light traveling from the light-receiving pixel in the +Z-axis direction in the image reading device according to the first embodiment in a case where the first opening is an aperture stop.

FIG. 21A is a diagram showing imaginary back light traveling from a light-receiving pixel in the +Z-axis direction in an image reading device according to a fourth comparative example, and FIG. 21B is a diagram showing imaginary back light traveling from a light-receiving pixel in the +Z-axis direction in an image reading device according to a fifth comparative example.

FIG. 22A is a diagram showing imaginary back light traveling from the light-receiving pixel in the +Z-axis direction, in the image reading device according to the first embodiment, and FIG. 22B is a diagram showing imaginary back light traveling from a light-receiving pixel in the +Z-axis direction, in an image reading device according to a variation of the first embodiment.

Figure 23:
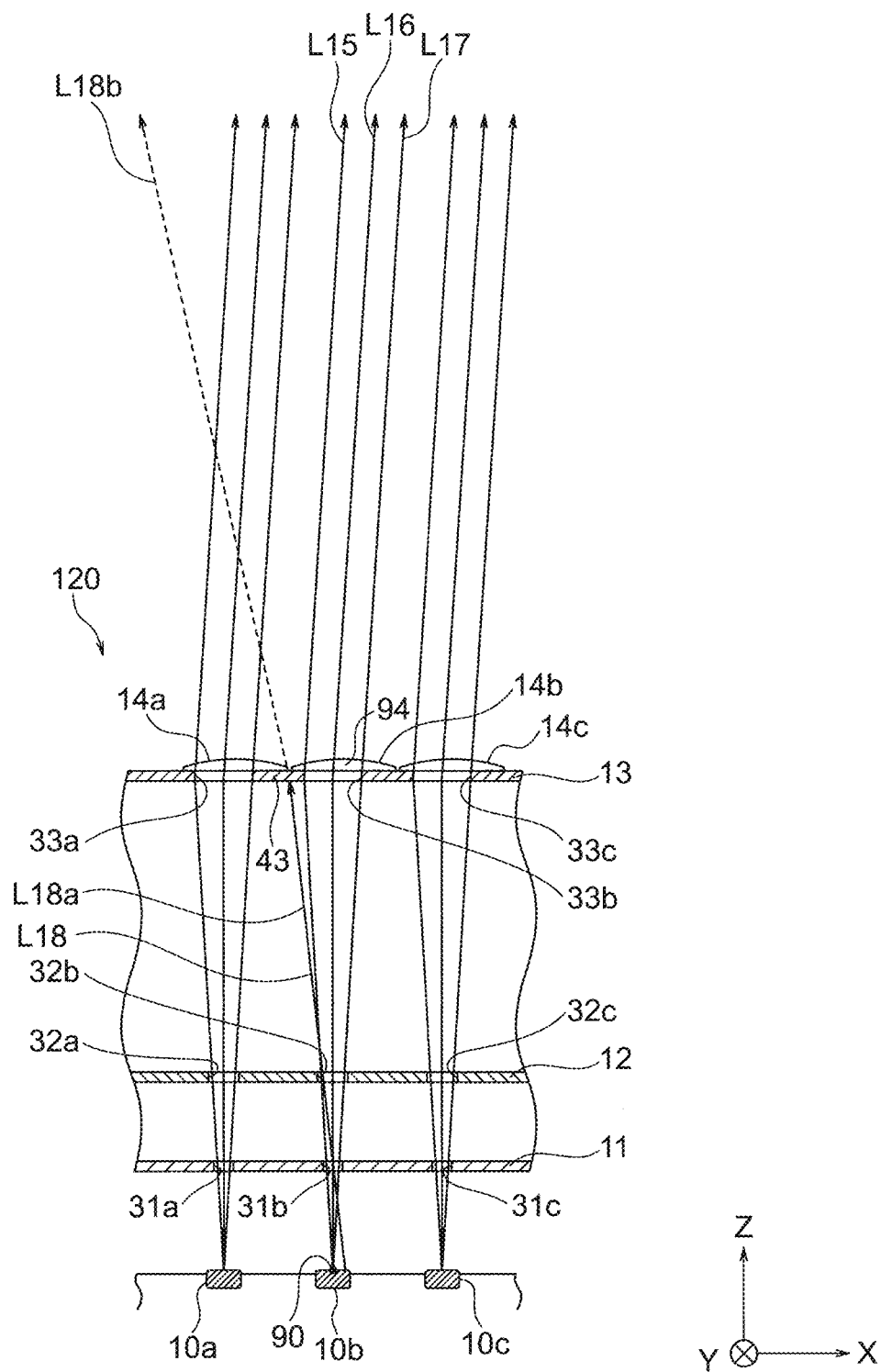

FIG. 23 is a diagram showing imaginary back light traveling from a light-receiving pixel in a +Z-axis direction, in an image reading device according to a variation of the first embodiment.

Figure 24:
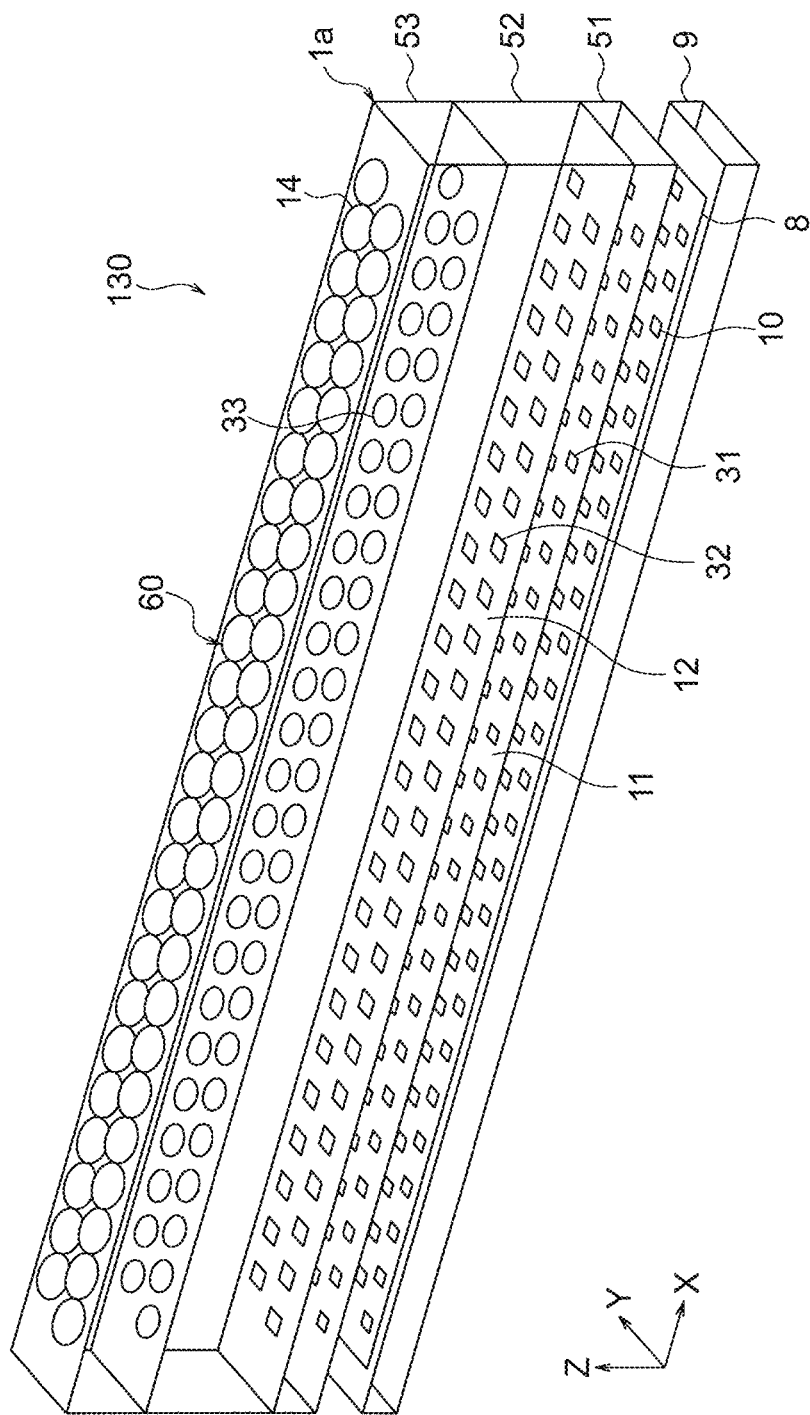

FIG. 24 is a perspective view schematically showing a configuration of an imaging optical unit of the image reading device according to the variation of the first embodiment.

Figure 25:
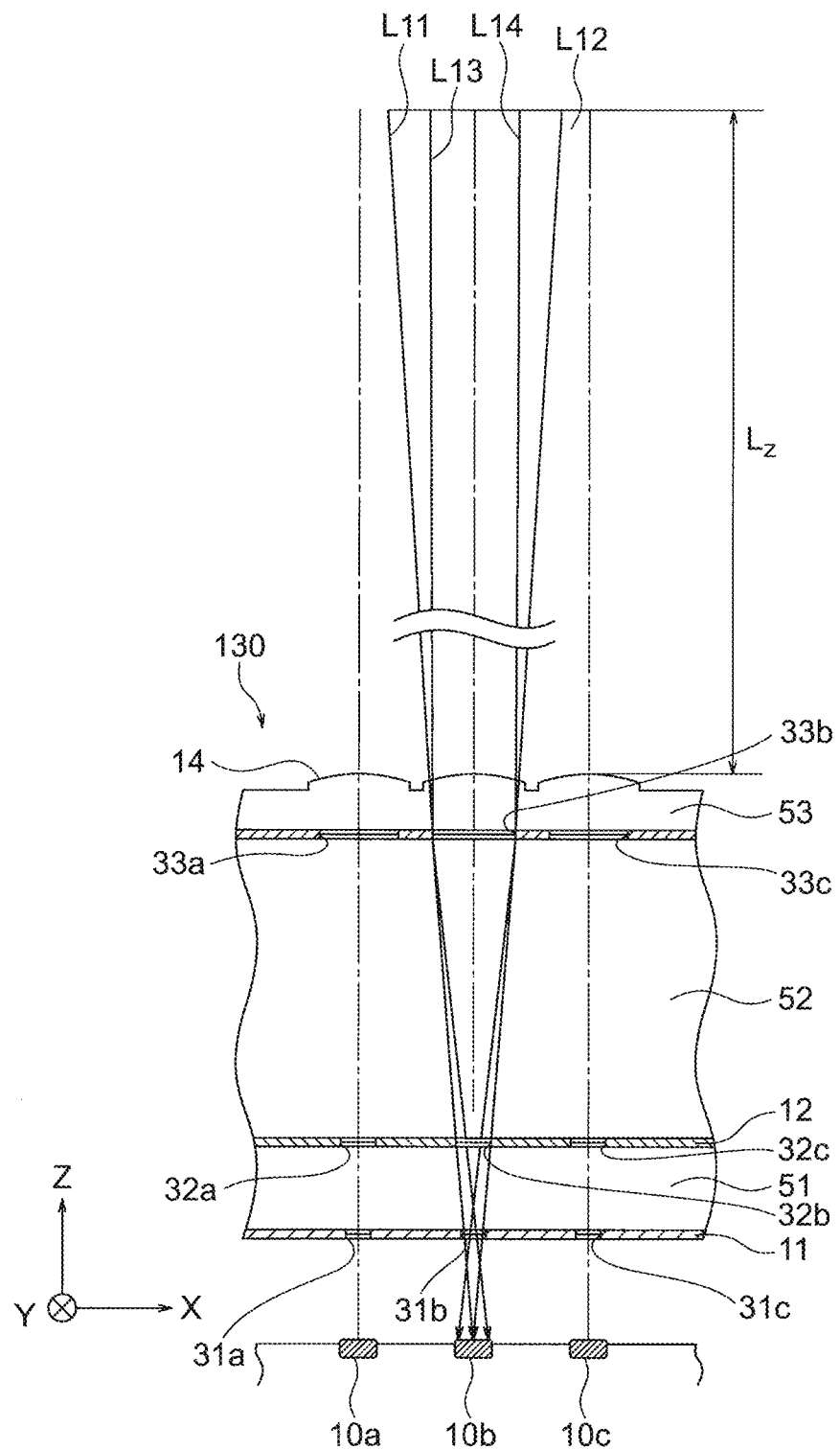

FIG. 25 is a diagram schematically showing reflected light entering the light-receiving pixel in the image reading device illustrated in FIG. 24.

Figure 26:
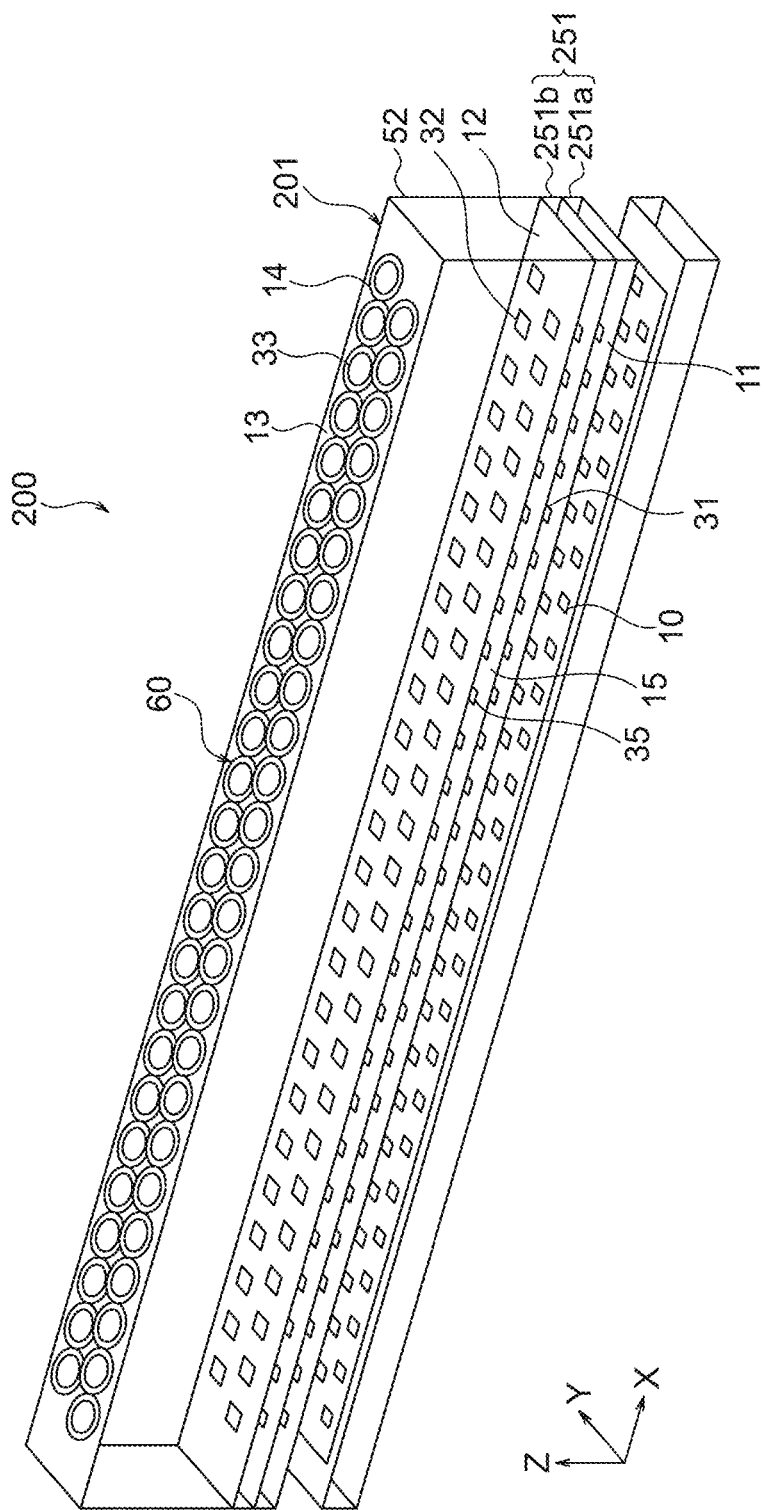

FIG. 26 is a perspective view schematically showing a configuration of an imaging optical unit of an image reading device according to a second embodiment.

Figure 27:
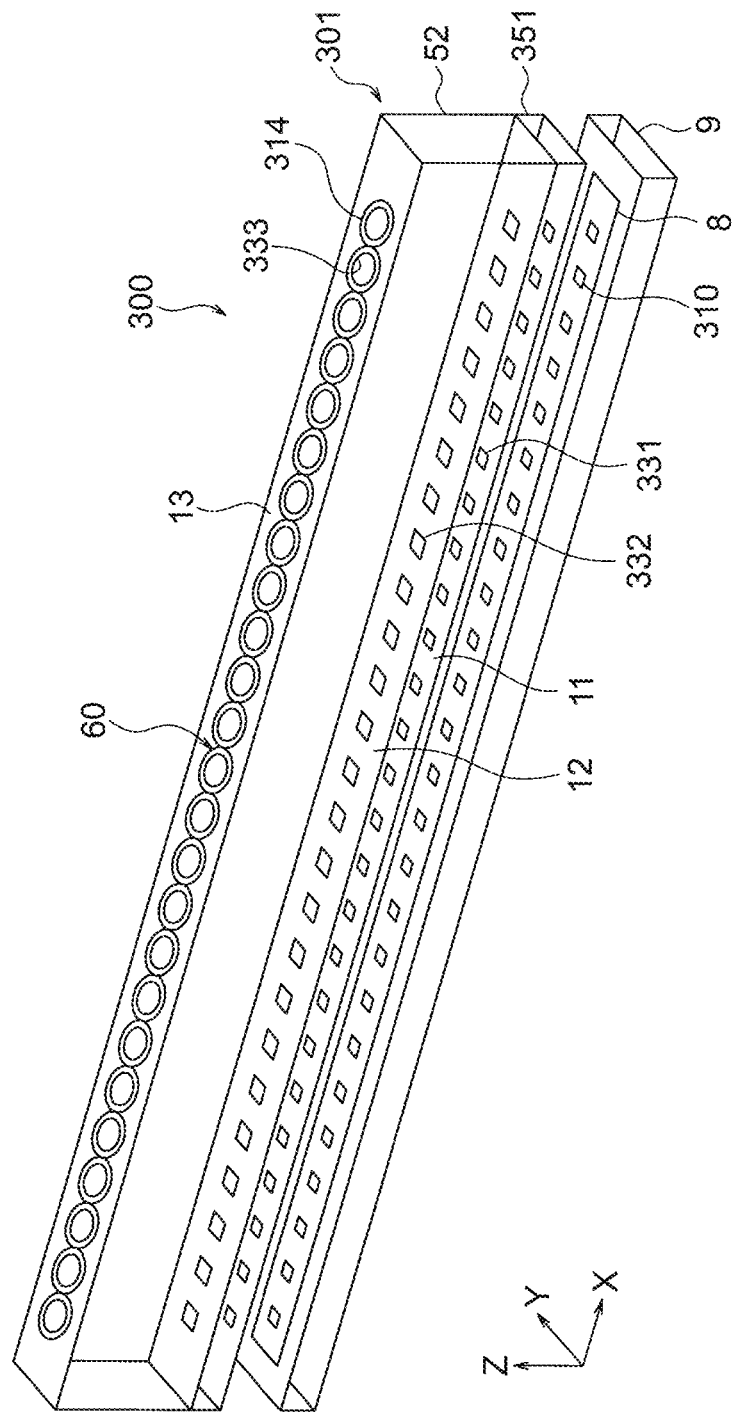

FIG. 27 is a perspective view schematically showing a configuration of an imaging optical unit of an image reading device according to a third embodiment.

Figure 28:
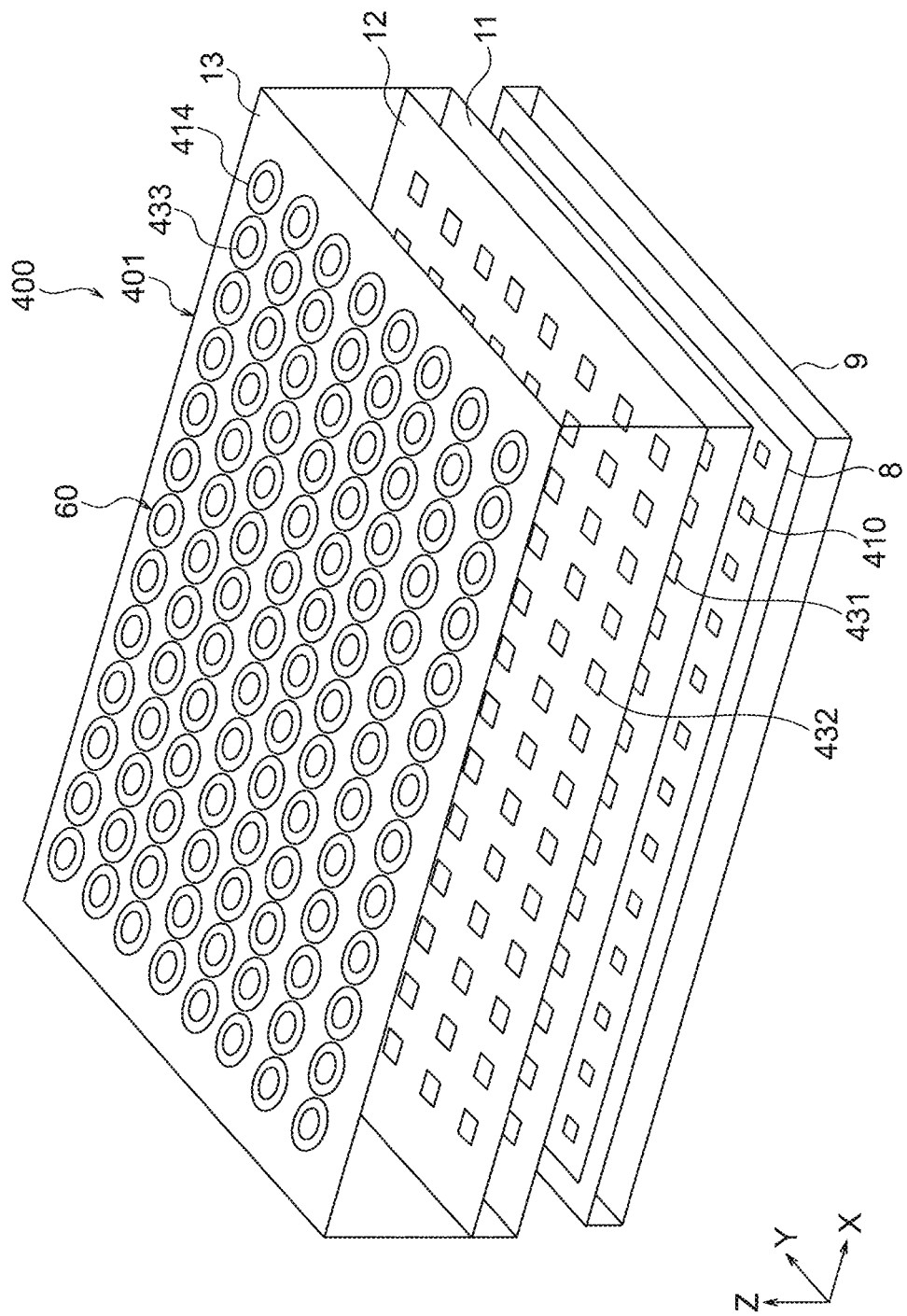

FIG. 28 is a perspective view schematically showing a configuration of an imaging optical unit of an image reading device according to a fourth embodiment.

MODE FOR CARRYING OUT THE INVENTION

Image reading devices according to embodiments of the present invention will be described hereinafter with reference to the drawings. The following embodiments are merely examples, and various changes may be made within the scope of the present invention.

In the figures, coordinate axes of an XYZ orthogonal coordinate system are shown to facilitate understanding of the description. The X axis is a coordinate axis parallel to a main scanning direction of an image reading device. The Y axis is a coordinate axis parallel to a sub-scanning direction of the image reading device. The Z axis is a coordinate axis orthogonal to the X axis and the Y axis.

4

First Embodiment

Configuration of Image Reading Device

Figure 1:
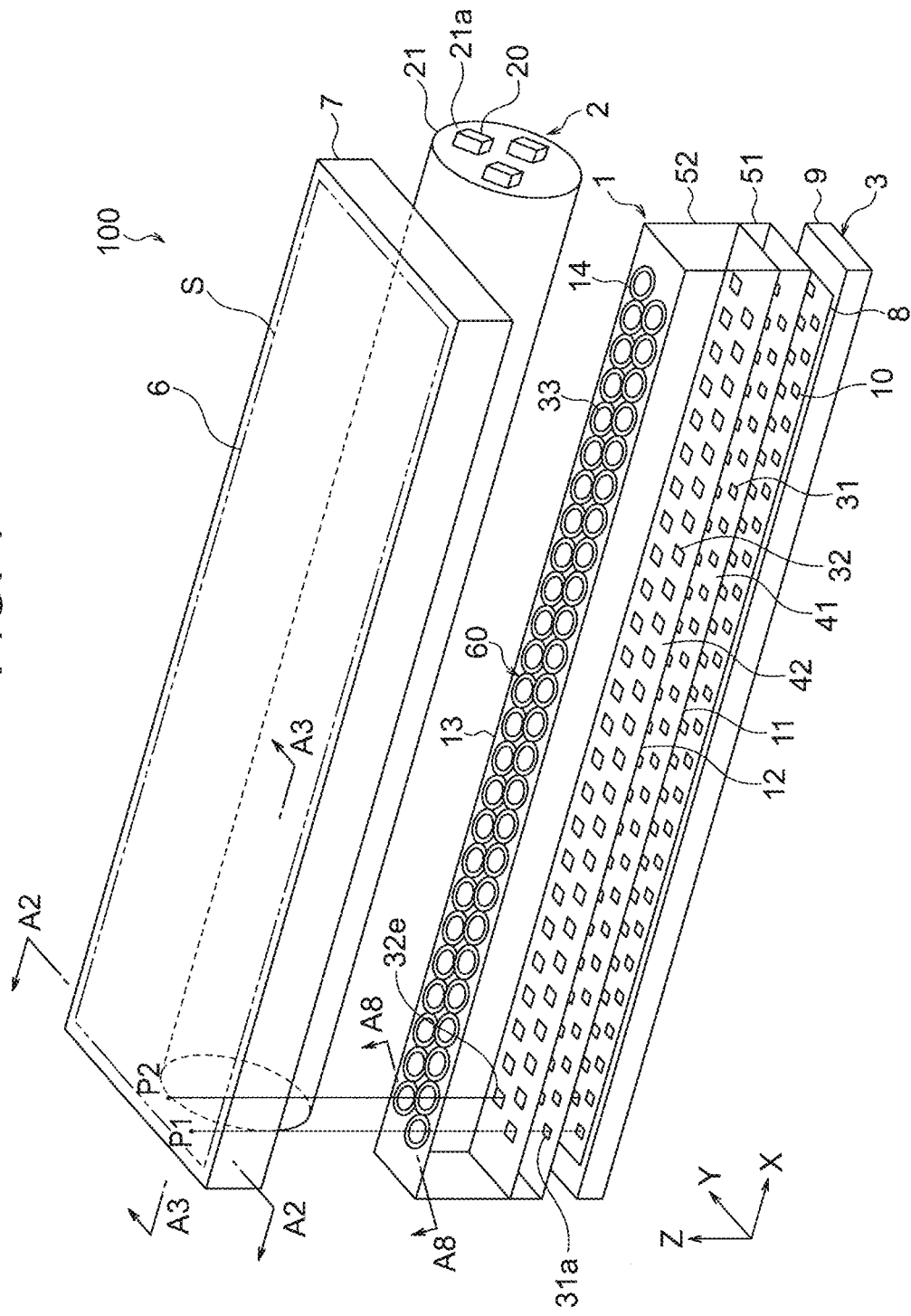
FIG. 1 is a perspective view schematically showing a main configuration of an image reading device according to a first embodiment of the present invention.
Figure 2:
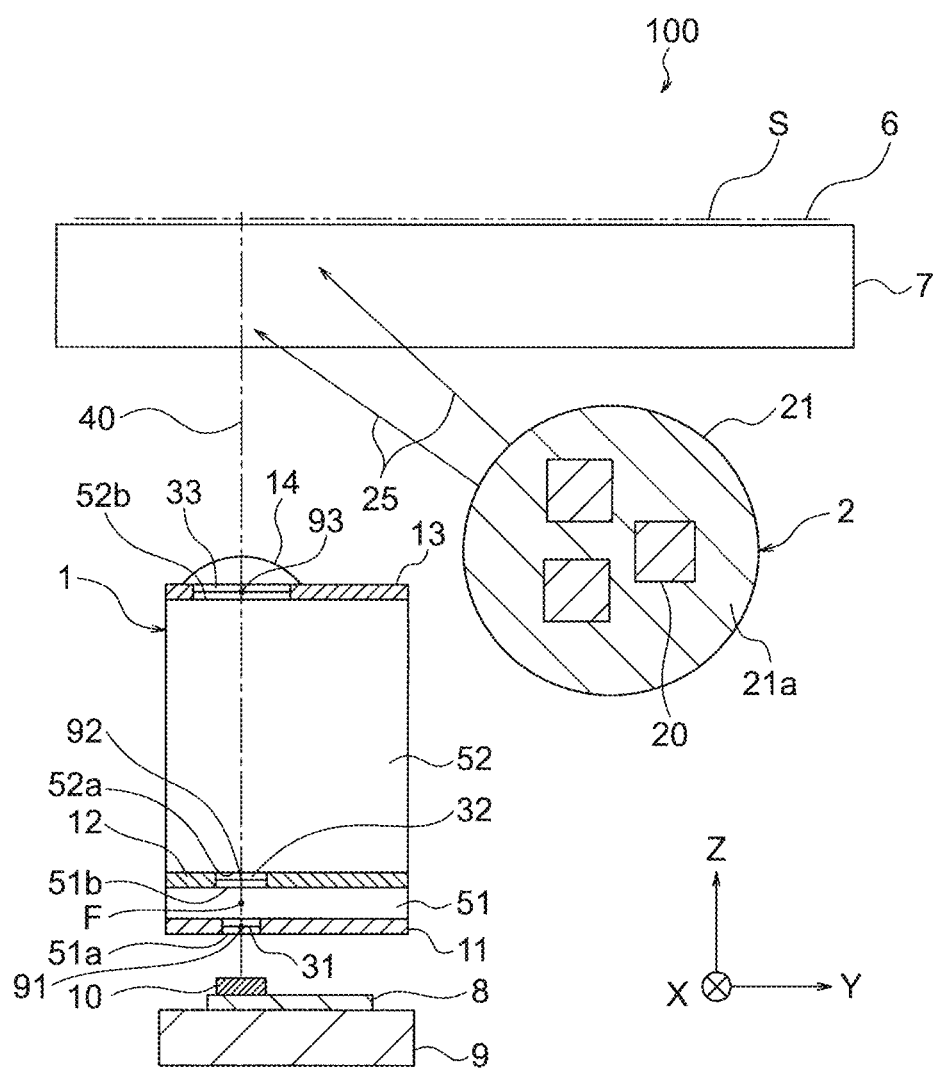
FIG. 2 is a cross-sectional view of the image reading device shown in FIG. 1 taken along line A2-A2.
Figure 3:
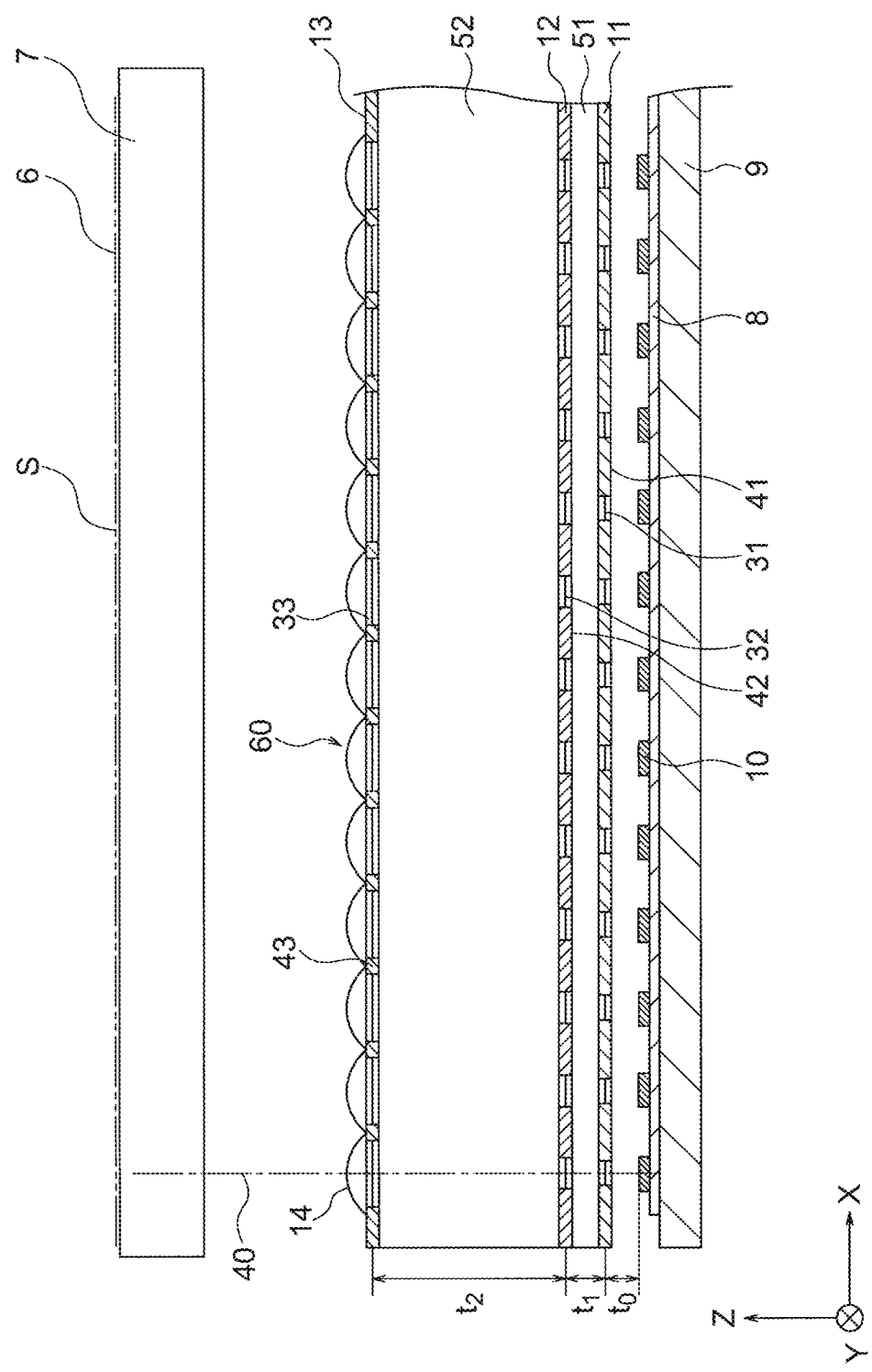
FIG. 3 is a cross-sectional view of the image reading device shown in FIG. 1 taken along line A3-A3.

FIG. 1 is a perspective view schematically showing a main configuration of an image reading device 100 according to a first embodiment. FIG. 2 is a cross-sectional view of the image reading device 100 shown in FIG. 1 taken along line A2-A2. FIG. 3 is a cross-sectional view of the image reading device 100 shown in FIG. 1 taken along line A3-A3. As shown in FIGS. 1 through 3, the image reading device 100 includes an imaging optical unit 1, an illumination optical unit 2, and a top panel glass 7 as a document placing table. When illumination light 25 is irradiated from the illumination optical unit 2 to a document 6 as an imaging object placed on the top panel glass 7, the illumination light 25 is reflected on the document 6 to serve as reflected light. The reflected light is received by the imaging optical unit 1 so that image information of the document 6 is thereby read. In the first embodiment, to allow the imaging optical unit 1 to acquire two-dimensional image information of the document 6, the document 6 is conveyed by a conveyor (not shown) along the top panel glass 7 in a sub-scanning direction (i.e., Y-axis direction) orthogonal to a main scanning direction (i.e., X-axis direction). Accordingly, the entire document 6 is allowed to be scanned. The scanning of the entire document 6 may be performed by moving the imaging optical unit 1 in the Y-axis direction with the document 6 being stationary.

The document 6 is an example of an imaging object captured by the imaging optical unit 1. The document 6 is, for example, a printed material on which characters, images, or the like are printed. The document 6 is placed on a predetermined reference surface S. The reference surface S is a surface on which the document 6 is placed, that is, the surface on the top panel glass 7. The top panel glass 7 is located between the document 6 and the imaging optical unit 1. The top panel glass 7 has a thickness of, for example, 1.0 mm. The configuration having the reference surface S on which the document 6 is placed is not limited to the top panel glass 7.

The imaging optical unit 1 includes a plurality of light-receiving pixels 10, a first light-shielding member 11 including a plurality of first openings 31, a second light-shielding member 12 including a plurality of second openings 32, a third light-shielding member 13 including a plurality of third openings 33, and a plurality of condenser lenses 14.

Figure 4:
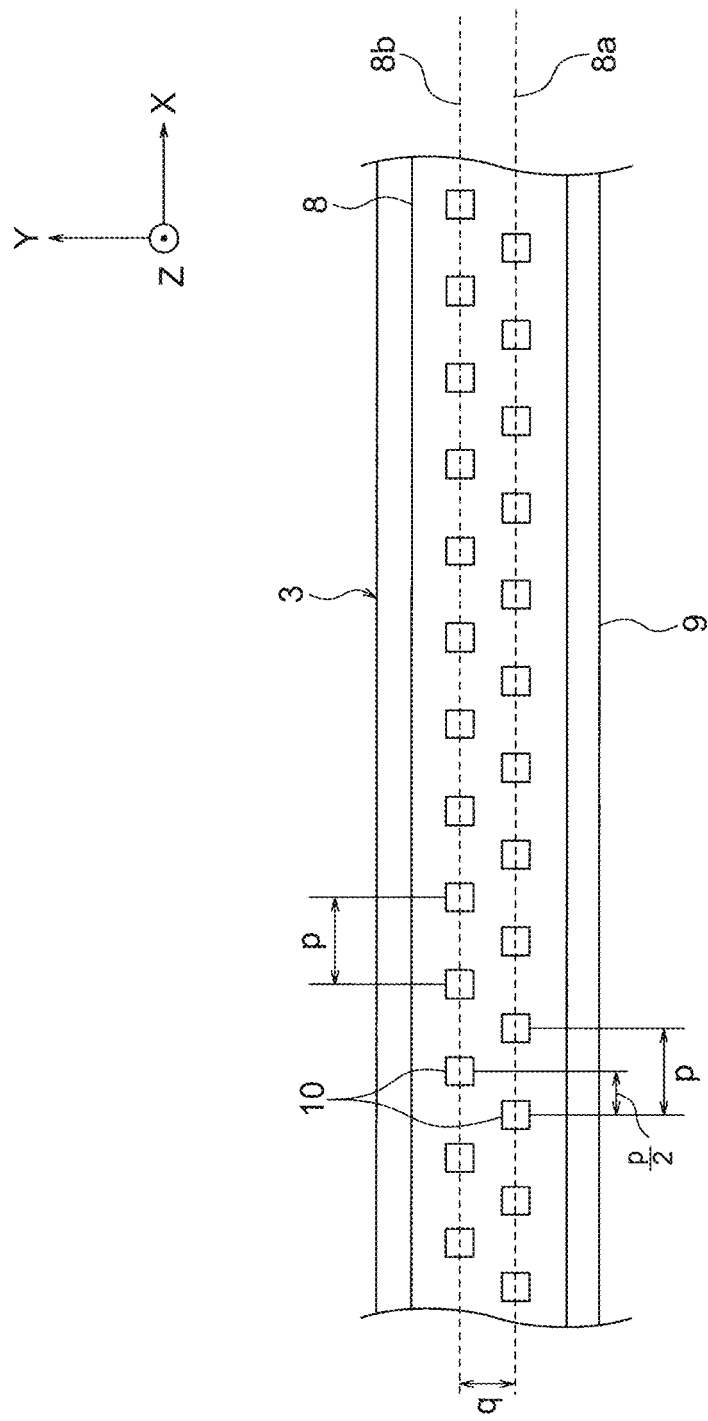
FIG. 4 is a plan view showing a part of an imaging sensor unit including a plurality of light-receiving pixels shown in FIG. 1.

FIG. 4 is a plan view showing a part of the imaging sensor unit 3 including the plurality of light-receiving pixels 10. As shown in FIGS. 1 and 4, the plurality of light-receiving pixels 10 included in an imaging sensor chip 8. The imaging sensor chip 8 is mounted on an imaging sensor board 9. The imaging sensor board 9 is a mounting board of a non-translucent member. The plurality of light-receiving pixels 10 are arranged in the X-axis direction that is a predetermined arrangement direction. The plurality of light-receiving pixels 10 include a first line 8a of light-receiving pixels 10 arranged in the X-axis direction, and a second line 8b of light-receiving pixels 10 arranged in the X-axis direction. The light-receiving pixels 10 receive reflected light reflected on the document 6. The size of a light-receiving region of one light-receiving pixel 10 is, for example, 63 μm×63 μm. A distance p in the X-axis direction between center positions of light-receiving pixels 10 adjacent to each other in the X-axis direction is, for example, 252 μm. A distance q in the Y-axis direction between the center positions of the light-receiving pixels 10 is, for example, 252 μm. In FIG. 4, the plurality of light-receiving pixels 10 are arranged in a staggered pattern. Specifically, the second line 8b of light-receiving pixels 10 are shifted in the X-axis direction by a distance p/2 of ½ of the distance p, from the adjacent first line 8a of light-receiving pixels 10. Accordingly, each of the light-receiving pixels 10 in the second line 8b is located at an intermediate position in the X-axis direction between the adjacent light-receiving pixels 10 in the first line 8a of light-receiving pixels 10.

As shown in FIGS. 1 through 3, the first light-shielding member 11 is disposed between the plurality of light-receiving pixels 10 and the reference surface S. The first light-shielding member 11 includes the plurality of first openings 31 through which reflected light reflected on the document 6 passes. A portion of the first light-shielding member 11 except the first openings 31 is a first light-shielding portion 41 that blocks reflected light. The second light-shielding member 12 is disposed between the plurality of first openings 31 and the reference surface S. The second light-shielding member 12 includes the plurality of second openings 32 through which reflected light reflected on the document 6 passes. A portion of the second light-shielding member 12 except the second openings 32 is a second light-shielding portion 42 that blocks reflected light. A first light-transmissive member 51 is disposed between the first light-shielding member 11 and the second light-shielding member 12.

The first light-shielding portion 41 of the first light-shielding member 11 and the second light-shielding portion 42 of the second light-shielding member 12 are thin light-shielding layers formed of chromium oxide films deposited on the first light-transmissive member 51. The first light-shielding member 11 is formed on a surface 51a (shown in FIG. 2) of the first light-transmissive member 51 facing the light-receiving pixels 10, and the second light-shielding member 12 is formed on a surface 51b (shown in FIG. 2) of the first light-transmissive member 51 facing the reference surface S. The first and second openings 31 and 32 are formed by etching using a deposited chromium oxide film as a mask pattern. Each of the first openings 31 has, for example, a square shape of 48 μm×48 μm, and each of the second openings 32 has, for example, a square shape of 76 μm×76 μm. The plurality of first openings 31 are arranged to correspond to the plurality of light-receiving pixels 10 respectively. In the first embodiment, when seen in the Z-axis direction, the plurality of first openings 31 overlap the plurality of light-receiving pixels 10 respectively. The plurality of second openings 32 are arranged to correspond to the plurality of light-receiving pixels 10 respectively. In the first embodiment, when seen in the Z-axis direction, the plurality of second openings 32 overlap the plurality of light-receiving pixels 10 respectively. The plurality of first openings 31 are arranged in two lines. The plurality of second openings 32 are arranged in two lines. The first openings 31 in each line are arranged in the X-axis direction. The second openings 32 in each line are arranged in the X-axis direction. The plurality of first openings 31 are arranged in a staggered pattern. The second openings 32 are arranged in a staggered pattern.

The first light-transmissive member 51 is a member that allows light to pass therethrough. The first light-transmissive member 51 is, for example, a transparent glass board. The first light-transmissive member 51 does not need to be completely transparent and may be translucent. The first light-transmissive member 51 has a refractive index n of, for example, 1.52. In the first embodiment, the first light-transmissive member 51 is constituted by one glass board. The first light-transmissive member 51 has a thickness $t_1$ (shown in FIG. 3) of, for example, 210 μm. The first light-transmissive member 51 is disposed at a distance $t_0$ (shown in FIG. 3) from the light-receiving pixels 10 in the Z-axis direction. The distance $t_0$ between the light-receiving pixels 10 and the first light-transmissive member 51 is, for example, 250 μm. A part or a whole of a gap between the first openings 31 and the second openings 32 may be space where no light-transmissive member is present.

In a case where wire bonding is employed as a method for electrically connecting the imaging sensor chip 8 and the imaging sensor board 9 to each other, a wire might jut from the surface of the imaging sensor chip 8 at +Z-axis side in the +Z-axis direction by about 100 μm to 200 μm. In the first embodiment, since the distance $t_0$ is 250 μm, which is longer than the wire, the wire jutting from the imaging sensor chip 8 does not interfere with the first light-transmissive member 51. In the first embodiment, a spacer member (not shown) having a thickness of 250 μm is disposed between the light-receiving pixels 10 and the first light-transmissive member 51 to thereby accurately obtain the distance $t_0$ of 250 μm.

The plurality of condenser lenses 14 are disposed between the plurality of second openings 32 and the reference surface S. The optical axis of each of the condenser lenses 14 is denoted by reference numeral 40. The condenser lenses 14 are disposed at a distance from the plurality of second openings 32 in an optical-axis direction (i.e., the Z-axis direction). The condenser lenses 14 have a function of concentrating reflected light reflected on the document 6. The condenser lenses 14 are, for example, convex lenses. The plurality of condenser lenses 14 are arranged to correspond to the plurality of light-receiving pixels 10 respectively. In the first embodiment, when seen in the Z-axis direction, the plurality of condenser lenses 14 overlap the plurality of light-receiving pixels 10 respectively. The plurality of condenser lenses 14 are arranged in two lines. The condenser lenses 14 in each line are arranged in the X-axis direction. The plurality of condenser lenses 14 are arranged in a staggered pattern. The condenser lenses 14 arranged in the staggered pattern constitute a condenser lens array 60. In the first embodiment, the diameter of each of the condenser lenses 14 is set in the range from several micrometers to several millimeters. A radius of curvature of a surface of each condenser lens 14 is, for example, 0.35 mm. The condenser lens array 60 is a microlens array including the plurality of tiny condenser lenses 14. The plurality of condenser lenses 14 overlap the plurality of first openings 31 respectively, and also overlap the plurality of second openings 32 respectively.

The third light-shielding member 13 is disposed between the second light-shielding member 12 and the plurality of condenser lenses 14. The third light-shielding member 13 includes the plurality of third openings 33 through which reflected light reflected on the document 6 passes. A portion of the third light-shielding member 13 except the third openings 33 is a third light-shielding portion 43 that blocks reflected light. A second light-transmissive member 52 is disposed between the second openings 32 and the third openings 33.

The third light-shielding portion 43 (shown in FIG. 3) of the third light-shielding member 13 is a thin light-shielding layer formed of a chromium oxide film deposited on the second light-transmissive member 52. The third light-shielding member 13 is formed on a surface 52b (shown in FIG. 2) of the second light-transmissive member 52 facing the reference surface S. The third openings 33 are formed by etching using a deposited chromium oxide film as a mask pattern. In FIG. 1, each of the third openings 33 is circular. The opening area of each of the third openings 33 is larger than that of each of the first and second openings 31 and 32.

That is, a diameter Φ of each of the third openings 33 is larger than each side of the first and second openings 31 and 32. For example, the diameter Φ is 170 μm. The plurality of third openings 33 are arranged to correspond to the plurality of light-receiving pixels 10 respectively. In the first embodiment, when seen in the Z-axis direction, the plurality of third openings 33 overlap the plurality of light-receiving pixels 10 respectively. The plurality of third openings 33 are arranged in two lines. The third openings 33 in each line are arranged in the X-axis direction. The plurality of third openings 33 are arranged in a staggered pattern. The plurality of third openings 33 overlap the plurality of first openings 31 respectively, and also the plurality of second openings 32 respectively. In addition, the plurality of third openings 33 overlap the plurality of condenser lenses 14 respectively.

The second light-transmissive member 52 is a member that allows light to pass therethrough. The second light-transmissive member 52 is, for example, a transparent glass board. The second light-transmissive member 52 does not need to be completely transparent and may be translucent. The second light-transmissive member 52 has a refractive index n of, for example, 1.52. As shown in FIG. 3, the second light-transmissive member 52 has a thickness $t_2$ larger than the thickness $t_1$ of the first light-transmissive member 51. The thickness $t_2$ of the second light-transmissive member 52 is, for example, 700 μm. A part or a whole of a gap between the second openings 32 and the third openings 33 may be space where no light-transmissive member is present.

As shown in FIG. 2, the second light-transmissive member 52 is fixed to the first light-transmissive member 51 by bonding with, for example, an adhesive such that center positions 93 of the third openings 33 overlap center positions 91 of the first openings 31 and center positions 92 of the second openings 32. To increase accuracy in positioning in adhering the second light-transmissive member 52 to the first light-transmissive member 51, the surface 52a of the second light-transmissive member 52 and the surface 51b of the first light-transmissive member 51 may include alignment marks for positioning.

Figure 5:
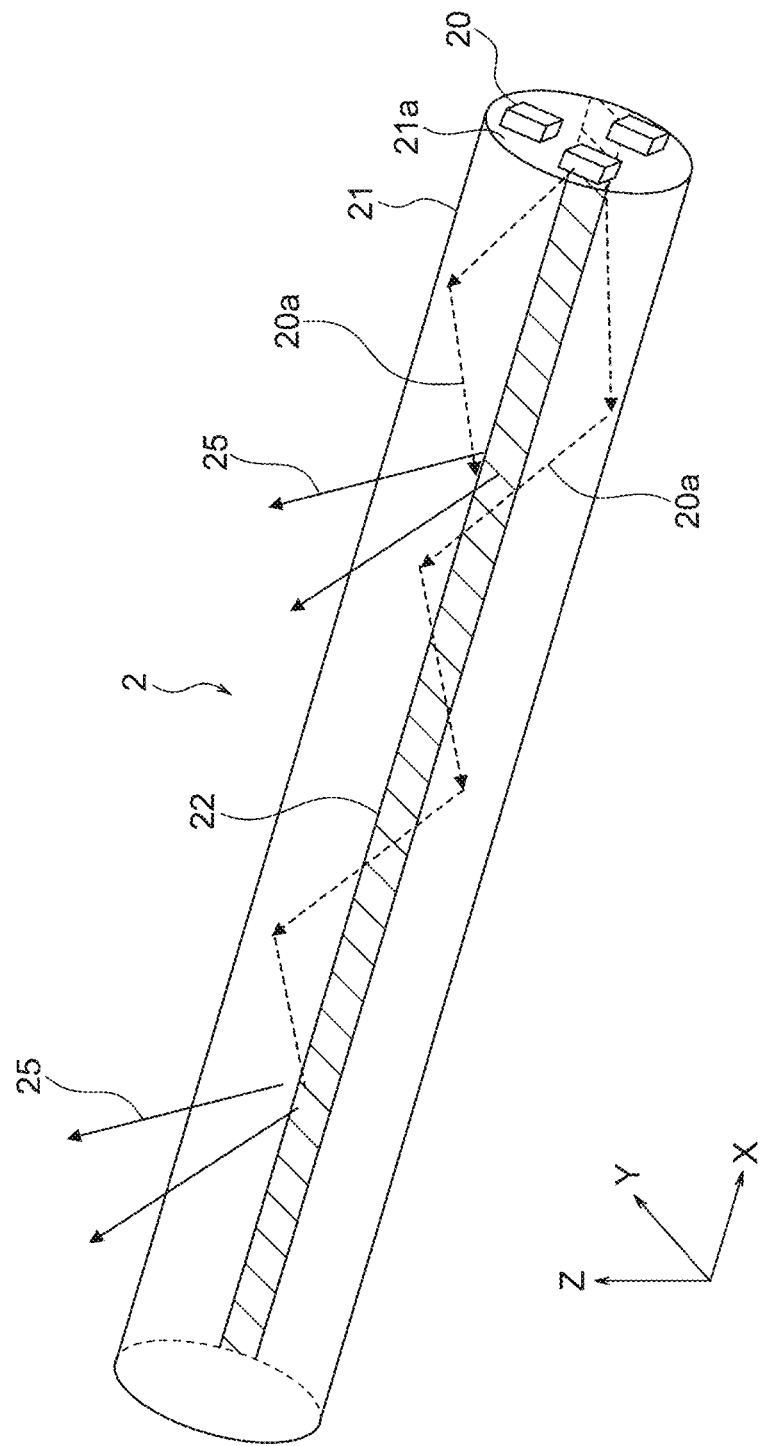
FIG. 5 is a diagram schematically showing a configuration of an illumination optical unit shown in FIG. 1 and illumination light irradiated from the illumination optical unit.

FIG. 5 is a diagram schematically showing a configuration of the illumination optical unit 2 illustrated in FIG. 1 and illumination light irradiated from the illumination optical unit 2. As shown in FIGS. 2 and 5, the illumination optical unit 2 includes a light source 20 and a light guide 21. The light source 20 is disposed at an end face 21a of the light guide 21. The light source 20 emits light 20a toward the inside of the light guide 21. The light source 20 is, for example, a semiconductor light source. The semiconductor light source is, for example, a light emitting diode (LED).

As shown in FIG. 5, the light guide 21 causes light 20a emitted from the light source 20 to travel toward the document 6. The light guide 21 is, for example, a cylindrical member of a light-transmissive resin material. Light 20a emitted from the light source 20 propagates while repeating total internal reflection in the light guide 21. A scattering region 22 is formed on a part of the inner surface of the light guide 21. Light 20a is scattered on the scattering region 22 to be scattered light. Part of the scattered light serves as illumination light 25 irradiating the document 6.

As shown in FIG. 2, illumination light 25 irradiated to the document 6 is reflected on the document 6 and becomes reflected light. The reflected light sequentially passes through the condenser lenses 14, the third openings 33, the second light-transmissive member 52, the second openings 32, the first light-transmissive member 51, and the first openings 31 in this order.

Condition for Acquiring Image not Affected by Stray Light

A condition for acquiring an image not affected by stray light in the image reading device 100 will now be described. FIG. 6 is a diagram showing a part of the configuration illustrated in FIG. 3, and reflected light passing through the second openings 32 and the first openings 31. With reference to FIG. 6, a condition for acquiring an image not affected by stray light traveling in the X-axis direction will be described. In FIG. 6, the plurality of light-receiving pixels 10 arranged in the X-axis direction are also denoted by 10a, 10b, and 10c. Similarly, the plurality of first openings 31 are also denoted by 31a, 31b, and 31c, and the plurality of second openings 32 are also denoted by 32a, 32b, and 32c. In the first and second openings 31 and 32 overlapping the light-receiving pixels 10, lines connecting the centers of the second openings 32, the centers of the first openings 31, and the light-receiving pixels 10 will also be referred to as optical axes 40a, 40b, and 40c.

In FIG. 6, reflected light passing through the second openings 32 and the first openings 31 are represented as light beams L1 through L3. As shown in FIG. 6, the light beam L1 enters the light-receiving pixel 10a after passing through the second opening 32a and the first opening 31a. In other words, the light beam L1 entering the light-receiving pixel 10a is a light beam that has passed through the second opening 32a and the first opening 31a located on the same optical axis 40a as that of the light-receiving pixel 10a. The light beam $L_2$ is a light beam passing through the second opening 32b and the first opening 31b located on the optical axis 40b different from the optical axis 40a. The light beam L3 is a light beam passing through the first openings 31c located on the optical axis 40c different from the optical axis 40a. The light beam $L_2$ and the light beam L3 do not reach the light-receiving pixel 10a. In this case, the imaging optical unit 1 can obtain an image not affected by stray light traveling in the X-axis direction. In the first embodiment, the light beam that has passed through the second openings 32 and the first openings 31 located on the optical axis of the light-receiving pixels 10 enter the light-receiving pixels 10 on this optical axis. That is, the light-receiving pixels 10 and the first openings 31 have an optically one-to-one relationship, and the light-receiving pixels 10 and the second openings 32 have an optically one-to-one relationship.

Figure 7A:
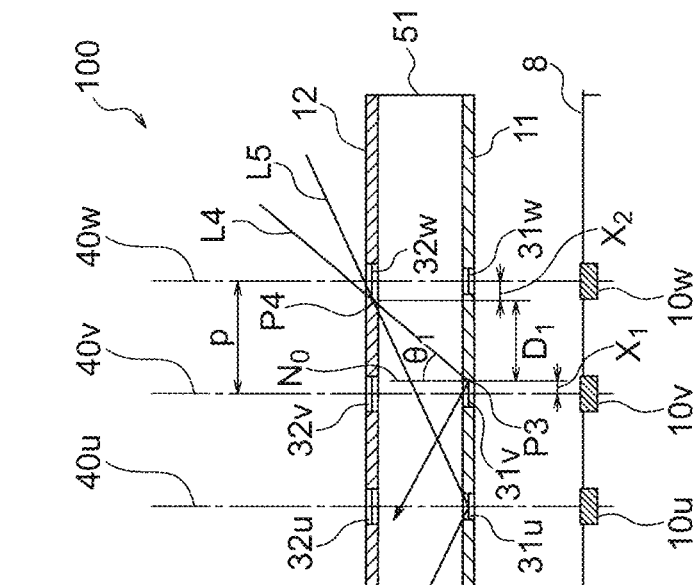
FIGS. 7A and 7B are diagrams for describing a condition that reflected light that has passed through second openings and first openings corresponding to light-receiving pixels enter the light-receiving pixels, in the image reading device according to the first embodiment.
Figure 7B:
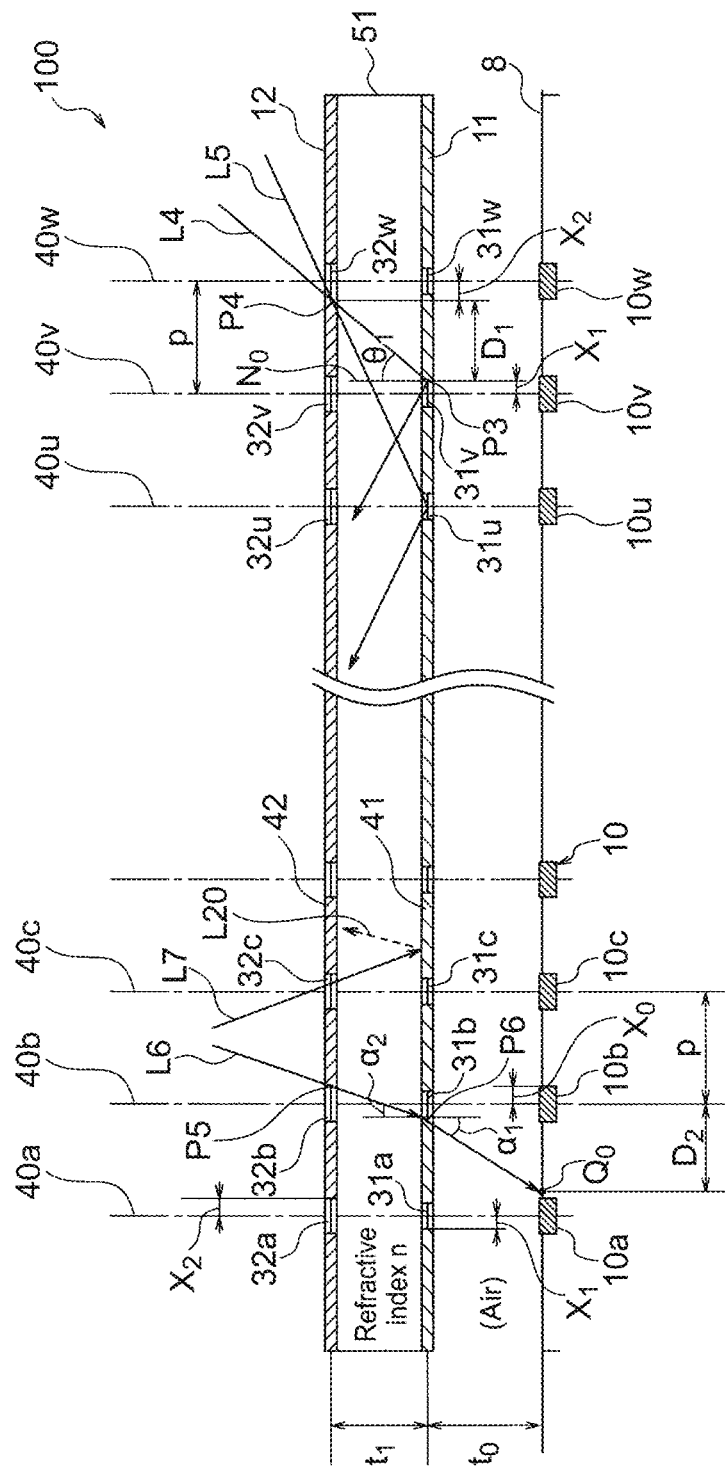

FIGS. 7A and 7B are diagrams for describing a condition that reflected light that has passed through the second openings 32 and the first openings 31 corresponding to light-receiving pixels 10 enter the light-receiving pixels 10, in the image reading device 100. As shown in FIGS. 7A and 7B, the first light-transmissive member 51 having the refractive index n is disposed at the distance $t_0$ from the light-receiving pixels 10. An air layer is present between the light-receiving pixels 10 and the first light-transmissive member 51. If the following conditions 1 and 2 are satisfied, reflected light that has passed through the second openings 32 and the first openings 31 corresponding to the light-receiving pixels 10 enter these light-receiving pixels 10.

(Condition 1)

There are no light beams passing through the second openings 32 and the first openings 31 having different optical axes.

(Condition 2)

Light beams that have passed through the second openings 32 and the first openings 31 having the same optical axis do not reach any portion except the light-receiving pixels 10 on this optical axis.

Conditions 1 and 2 will be described with reference to FIGS. 7A and 7B. As shown in FIG. 7A, Condition 1 is established when the light beam satisfies a total internal reflection condition. Specifically, a light-receiving pixel 10v of the plurality of light-receiving pixels 10 and light-receiving pixels 10u and 10w adjacent to the light-receiving pixel 10v will be described. If an incident angle $\theta_1$ of a light beam L4 passing through a point P3 in a first opening 31v overlapping the light-receiving pixel 10v and a point P4 in a second opening 32w overlapping the light-receiving opening 32w is larger than a critical angle $\theta_c$, the light beam entering the first opening 31v satisfies the total internal reflection condition. Here, the incident angle $\theta_1$ of the light beam L4 is an angle formed by a normal N$_0$ to the first light-shielding member 11 and the light beam L4. The point P3 is an end portion of the first opening 31v closest to the first opening 31w. The point P4 is an end portion of the second opening 32w closest to the second opening 32v.

A light beam L5 shown in FIG. 7A is a light beam passing through the second opening 32w and enters a first opening 31u. Since the light beam L4 is totally reflected in the first opening 31v, the light beam L5 having an incident angle larger than that of the light beam L4 is totally reflected in the first opening 31u. Thus, the light beam L5 does not pass through the first opening 31u.

Here, a half opening width that is ½ of the opening width of the first opening 31 in the X-axis direction is defined as $X_1$, and a half opening width that is ½ of the opening width of the second opening 32 in the X-axis direction is defined as $X_2$. A distance $D_1$, in the X-axis direction, between an end of the second opening 32w in the −X-axis direction and an end of the first opening 31v in the +X-axis direction is obtained by Equation (1):

$$D_1 = p - X_1 - X_2 \quad (1)$$

As is obvious from FIG. 7A, with respect to the incident angle $\theta_1$ of the light beam L4, Equation (2) is established:

$$\tan \theta_1 = D_1/t_1 = (p - X_1 - X_2)/t_1 \quad (2)$$

Here, in order for the light beam L4 entering at the incident angle $\theta_1$ to satisfy the total internal reflection condition, it is necessary to satisfy Equation (3):

$$n \cdot \sin \theta_1 > 1 \quad (3)$$

From Equation (2) and Equation (3), with respect to the thickness $t_1$ of the first light-transmissive member 51 satisfying Condition 1, Equation (4) below is derived:

$$t_1 < \sqrt{n^2 - 1} \cdot (p - X_1 - X_2) \quad (4)$$

Specifically, if the thickness $t_1$ of the first light-transmissive member 51 is smaller than the value at the right side of Equation (4), the light beam L4 satisfies the total internal reflection condition. In this case, Condition 1 is established.

Next, Condition 2 will be described with reference to FIG. 7B. One light-receiving pixel 10b of the plurality of light-receiving pixels 10 and light-receiving pixels 10a and 10c adjacent to both sides of the light-receiving pixel 10b in the X-axis direction will be described as an example. Condition 2 is established if a light beam L6 passing through a point P5 in the second opening 32b overlapping the light-receiving pixel 10b and a point P6 in the first opening 31b overlapping the light-receiving pixel 10b reaches a region between the light-receiving pixel 10a and the light-receiving pixel 10c and does not enter any of the light-receiving pixel 10a and the light-receiving pixel 10c. The region between the light-receiving pixel 10a and the light-receiving pixel 10c is a region sandwiched between the right end of the light-receiving pixel 10a and the left end of the light-receiving pixel 10c shown in FIG. 7B.

The light beam L6 shown in FIG. 7B is a light beam passing through the second opening 32b and the first opening 31b overlapping the second opening 32b. In FIG. 7B, the light beam L6 passes through an end portion of the second opening 32b closest to the second opening 32c, and then passes through an end portion of the first opening 31b closest to the first opening 31a. The light beam L6 that has passed through the first opening 31b reaches a point Q$_0$. Here, the point Q$_0$ represents a point which is located between the light-receiving pixel 10a and the light-receiving pixel 10c and which the light beam L6 reaches. In FIG. 7B, the point Q$_0$ is a point farthest from the light-receiving pixel 10b in the −X-axis direction, that is, a point closest to the light-receiving pixel 10a. In a case where the light beam L6 reaches a portion of the light-receiving pixel 10a closer to the light-receiving pixel 10b than the end portion of the light-receiving pixel 10a closest to the light-receiving pixel 10b, the light beam that has passed through the second opening 32b and the first opening 31b does not reach light-receiving pixels (e.g., the light-receiving pixels 10a and 10c)) except for light-receiving pixel 10b.

Here, supposing an emission angle of the light beam L6 is $\alpha_1$, and an incident angle of the light beam L6 is $\alpha_2$, the incident angle $\alpha_2$ is obtained by Equation (5):

$$\tan \alpha_2 = (X_1 + X_2)/t_1 \quad (5)$$

According to the Snell's law, a relationship between the emission angle $\alpha_1$ and the incident angle $\alpha_2$ is expressed by Equation (6):

$$n \cdot \sin \alpha_2 = \sin \alpha_1 \quad (6)$$

A distance $D_2$ from the optical axis 40b to the point Q$_0$ is obtained by Equation (7):

$$D_2 = X_1 + t_0 \cdot \tan \alpha_1 \quad (7)$$

Here, supposing a half width of the light-receiving pixel 10b that is ½ of the width of the light-receiving pixel 10b in the X-axis direction is $X_0$, a condition that the point Q$_0$ is located closer to the light-receiving pixel 10b than an end portion of the light-receiving pixel 10a in the +X-axis direction is expressed by Equation (8):

$$p - X_0 > X_1 + t_0 \cdot \tan \alpha_1 \quad (8)$$

From Equation (5) through Equation (8), with respect to the thickness $t_1$ of the first light-transmissive member 51 satisfying Condition 2, Equation (9) below is derived:

$$t_1 > (X_1 + X_2) \cdot \sqrt{n^2 - 1 + \frac{n^2 \cdot t_0^2}{(p - X_1 - X_0)^2}} \quad (9)$$

That is, if the thickness $t_1$ of the first light-transmissive member 51 is larger than a value at the right side of Equation (9), the above described Condition 2 is established.

In an example of the first embodiment, $X_0 = 31.5$ μm, $X_1 = 24$ μm, $X_2 = 38$ μm, $n = 1.52$, $t_0 = 250$ μm, and $p = 252$ μm. If these values are substituted into Equation (4) and Equation (9), the right side of Equation (4) is 217.5 μm, and the right side of Equation (9) is 139 μm. In this example, since the thickness $t_1$ of the first light-transmissive member 51 is 210 μm, Equation (4) that defines the upper limit of the thickness $t_1$ and Equation (9) that defines the lower limit of the thickness $t_1$ are satisfied. Accordingly, reflected light that has passed through the second openings 32 and the first openings 31 corresponding to the light-receiving pixels 10 enters the light-receiving pixels 10, and thus, an image not affected by stray light is acquired.

Next, other advantages obtained by the presence of the first and second light-shielding members 11 and 12 in the image reading device 100 will be described. As shown in FIG. 7A, the light beam L4 that has passed through the second opening 32w is totally reflected in the first opening 31v, and thus, does not reach the light-receiving pixel 10v. The light beam L5 is also totally reflected in the first opening 31u, and thus, does not reach the light-receiving pixel 10u. In addition, as shown in FIG. 7B, a light beam L7 that has passed through the second opening 32c is blocked by the first light-shielding portion 41 of the first light-shielding member 11. Even if part of the light beam L7 is reflected on the first light-shielding member 11 and travels in the +Z-axis direction as a light beam L20, the light beam L20 is blocked by the second light-shielding portion 42 of the second light-shielding member 12.

Here, as an image reading device, a configuration in which a light-absorbing member having a through hole elongated in the Z-axis direction is disposed between a light-receiving pixel and a reference surface instead of the first and second light-shielding members 11 and 12 and the first light-transmissive member 51 shown in FIGS. 7A and 7B is considered for comparison. In this configuration, a light beam traveling in parallel with the axis of the through hole reaches the light-receiving pixel after passing through the through hole. The inner surface of the through hole functions as a light-shielding wall that blocks a light beam having a tilt angle with respect to the axis. However, part of the light beam that has entered the through hole might be scattered at the light-shielding wall. In this case, if the scattered light beam enters a light-receiving pixel not corresponding to the through hole, image information acquired from the light-receiving pixel is affected by stray light. On the other hand, in the first embodiment, since the light beam that has passed through the second openings 32 is totally reflected in the first openings 31 or blocked by the first and second light-shielding members 11 and 12 as shown in FIGS. 7A and 7B, an image not affected by stray light can be acquired as compared to a configuration in which the image reading device includes a light-absorbing member.

Figure 8:
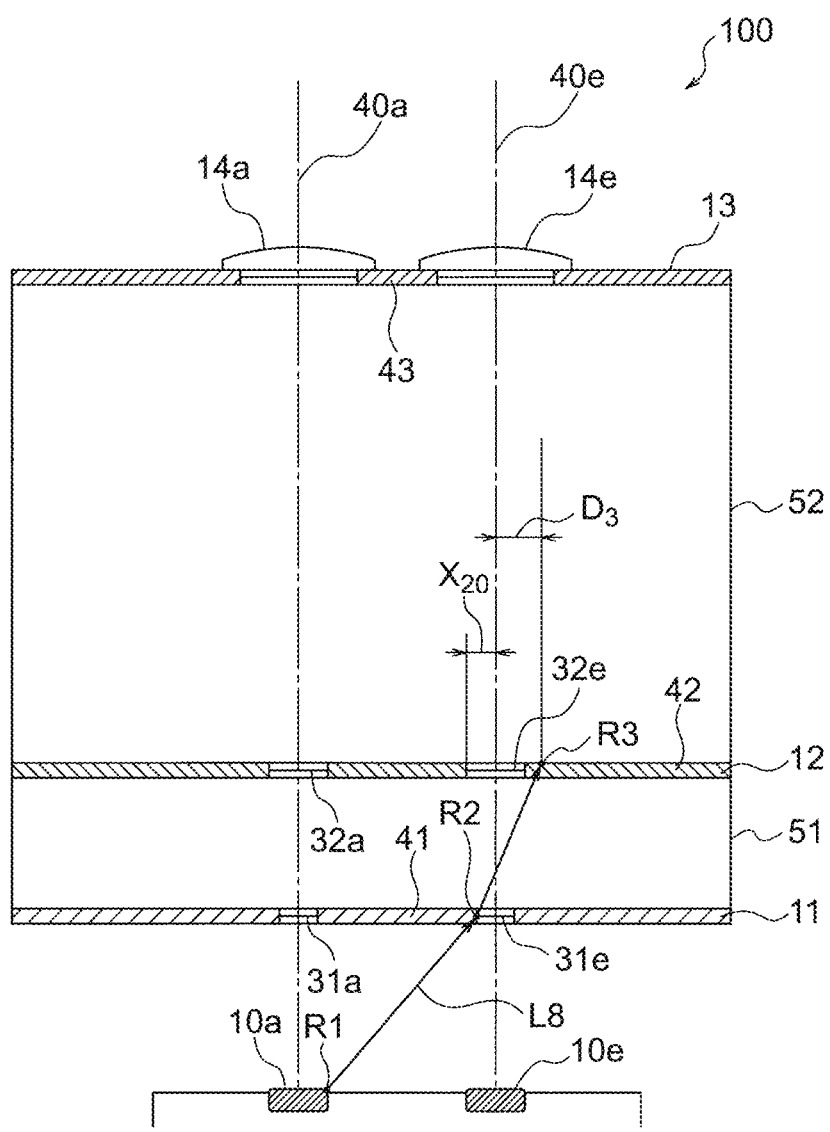
FIG. 8 is a cross-sectional view of the image reading device shown in FIG. 1 taken along line A8-A8.

Then, description will be given on a condition for preventing a light beam that has passed through the second openings 32 and the first openings 31 at locations overlapping the light-receiving pixels 10 in one of two lines of the light-receiving pixels 10 from entering the light-receiving pixels 10 in the other line in the image reading device 100. FIG. 8 is a cross-sectional view of the image reading device 100 shown in FIG. 1 taken along line A8-A8. More specifically, FIG. 8 is a cross-sectional view of a plane including the point P1 and the point P2 shown in FIG. 1. In the following description, the light-receiving pixels 10 arranged in the first line 8a (shown in FIG. 4) will also be referred to as a light-receiving pixel 10a, and the light-receiving pixels 10 arranged in the second line 8b (shown in FIG. 4) will also be referred to as a light-receiving pixel 10e. The first and second openings 31 and 32 overlapping the light-receiving pixel 10a will also be denoted by 31a and 32a, and the first and second openings 31 and 32 overlapping the light-receiving pixel 10e will also be denoted by 31e and 32e. The condenser lens 14 overlapping the second opening 32a will also be denoted by 14a, and the condenser lens 14 overlapping the second opening 32e will also be denoted by 14e. The optical axis of the condenser lens 14a is denoted by 40a, and the optical axis of the condenser lens 14e is denoted by 40e.

Next, a condition for preventing a light beam that has passed through the second opening 32e and the first opening 31e from entering the light-receiving pixel 10a will be described. In this description, as shown in FIG. 8, a back light beam L8 that is an imaginary light beam traveling from the light-receiving pixel 10a toward the first opening 31e is used. The back light beam L8 is a light beam passing from a point R1 to a point R2 and reaching a point R3. The point R1 is an end of the light-receiving pixel 10a closest to the light-receiving pixel 10e. The point R2 is an end of the first opening 31e closest to the first opening 31a. The point R3 is a point located at an outer side of an end portion of the second opening 32e farthest from the second opening 32a. If the back light beam L8 reaches the first light-shielding portion 41 or the second light-shielding portion 42, a light beam that has passed through the second opening 32e and the first opening 31e does not enter the light-receiving pixel 10a. In FIG. 8, a case where the back light beam L8 reaches the second light-shielding portion 42 will be described as an example.

In FIG. 8, a distance between the point R3 and the optical axis 40e is denoted by $D_3$, and a length of ½ of a diagonal length of the square second opening 32e is denoted by $X_{20}$. If the distance $D_3$ is larger than the length $X_{20}$, the back light beam L8 reaches the second light-shielding portion 42. Accordingly, the light beam that has passed through the second opening 32e and the first opening 31e does not enter the light-receiving pixel 10a. Even in a case where the distance $D_3$ is smaller than the length $X_{20}$ and the back light beam L8 passes through the second opening 32e, if the distance q shown in FIG. 4 is large, the back light beam L8 reaches the third light-shielding portion 43 of the third light-shielding member 13. Thus, even in the case where the distance $D_3$ is smaller than the length $X_{20}$, since the distance q is large and the image reading device 100 includes the third light-shielding member 13, the light beam that has passed through the second opening 32e and the first opening 31e does not enter the light-receiving pixel 10a.

Image Restoration

A method for restoring an image of the document 6 by the imaging optical unit 1 based on image information acquired from the light-receiving pixels 10 will now be described. In the first embodiment, since the plurality of light-receiving pixels 10 are arranged in a staggered pattern as shown in FIG. 4, the center positions of the light-receiving pixels 10 in the first line 8a and the center positions of the light-receiving pixels 10 in the second line 8b are shifted from each other in the Y-axis direction by a distance q. Thus, it is necessary to restore the image to an image without a positional shift even in a case where the document 6 is scanned in the Y-axis direction. Specifically, it is sufficient to perform a process of shifting image information by the number of pixels corresponding to the distance q in the Y-axis direction after an image processing circuit (not shown) acquires image information from the light-receiving pixels 10 in the first line 8a and image information from the light-receiving pixels 10 in the second line 8b. In FIG. 4, the light-receiving pixels 10 in the second line 8b are shifted from the light-receiving pixels 10 in the first line 8a in the X-axis direction by a distance p/2 that is ½ of the distance p. The image processing circuit acquires outputs from the light-receiving pixels 10 at time intervals in which the document 6 is conveyed in the Y-axis direction by a distance p/2. In the first embodiment, a resolution in the X-axis direction is equal to a resolution in the Y-axis direction. The distance q indicating the amount of positional shift of image information is preferably an integral multiple of the distance p/2, but the present invention is not limited to this example. The image processing circuit may estimate a luminance value at a sub-pixel position by using a pixel interpolation process to synthesize image information using the estimated luminance value. The image processing circuit may synthesize the acquired image information by shifting a timing when the light-receiving pixels 10 in the first line 8a acquire image information and a timing when the light-receiving pixels 10 in the second line 8b acquire image information are shifted from each other.

Increase in Depth of Field

A configuration in which the depth of field of the image reading device 100 is increased will now be described in comparison to first and second comparative examples. The following description is directed to an example of a configuration in which the depth of field is increased in order to acquire an image with a resolution of 200 dpi (i.e., distance p=252 µm).

Figure 9:
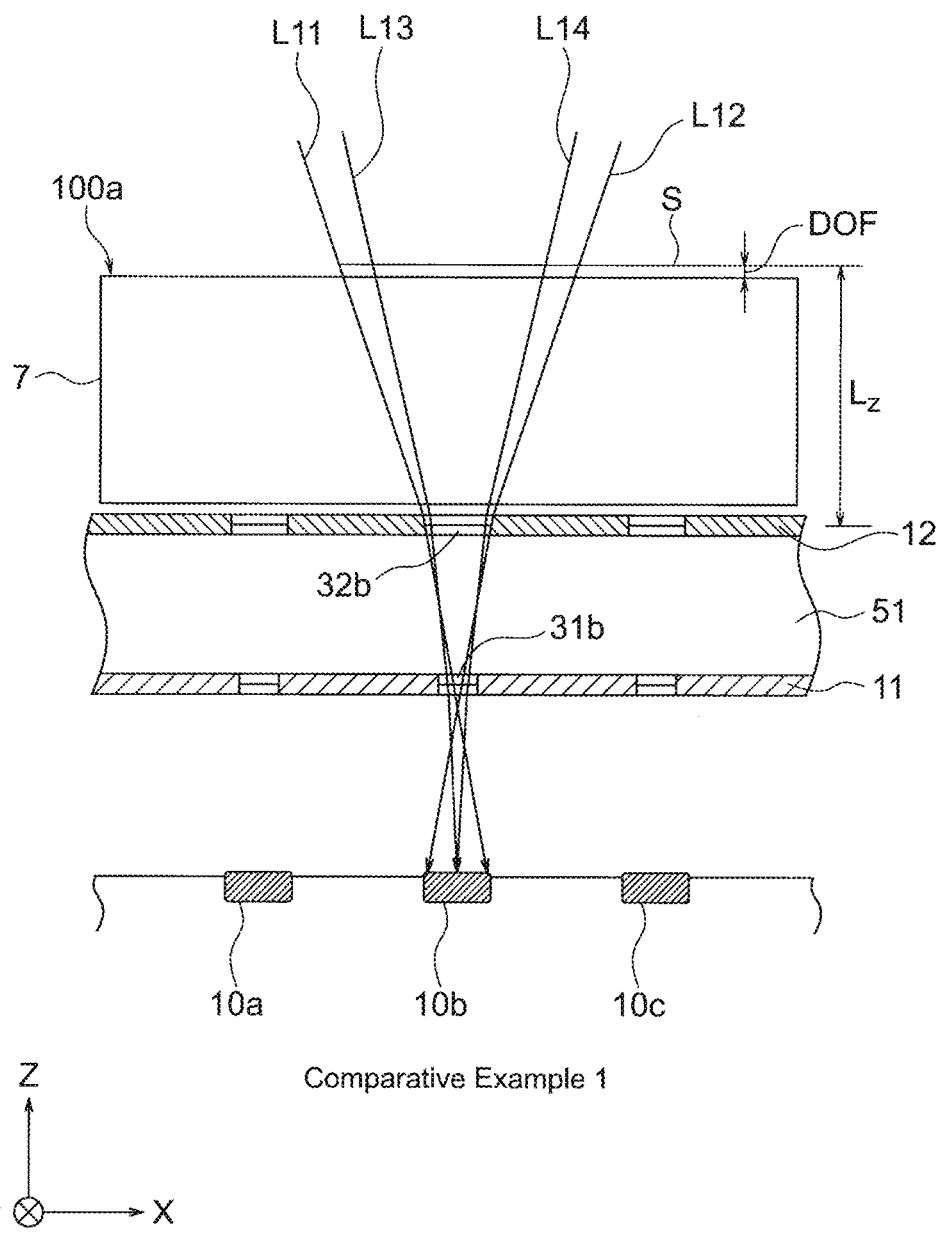
FIG. 9 is a diagram schematically showing reflected light entering a light-receiving pixel in an image reading device according to a first comparative example.

FIG. 9 is a diagram schematically showing reflected light entering the light-receiving pixel 10b in an image reading device 100a according to a first comparative example. As shown in FIG. 9, the image reading device 100a of the first comparative example is different from the image reading device 100 according to the first embodiment (shown in FIG. 15 described later) in including none of the third light-shielding member 13, the condenser lenses 14, and the second light-transmissive member 52 in the first embodiment. Light beams L11 through L14 are light beams illustrated as representatives of light beams entering the light-receiving pixel 10b. In the following description, a group of a plurality of light beams will be referred to as a light flux. The light beam L11 is a light beam entering one end portion of the light-receiving pixel 10b in the X-axis direction, and the light beam L12 is a light beam entering the other end portion of the light-receiving pixel 10b in the X-axis direction. The light beam L13 is a light beam entering a portion near the center of the light-receiving pixel 10b, and the light beam L14 is another light beam entering a portion near the center of the light-receiving pixel 10b. Each of the distance between the light beams L11 and L12 in the X-axis direction and the distance between the light beams L13 and L14 in the X-axis direction increase as the distance from the second opening 32b in the +Z-axis direction increases.

Figure 10:
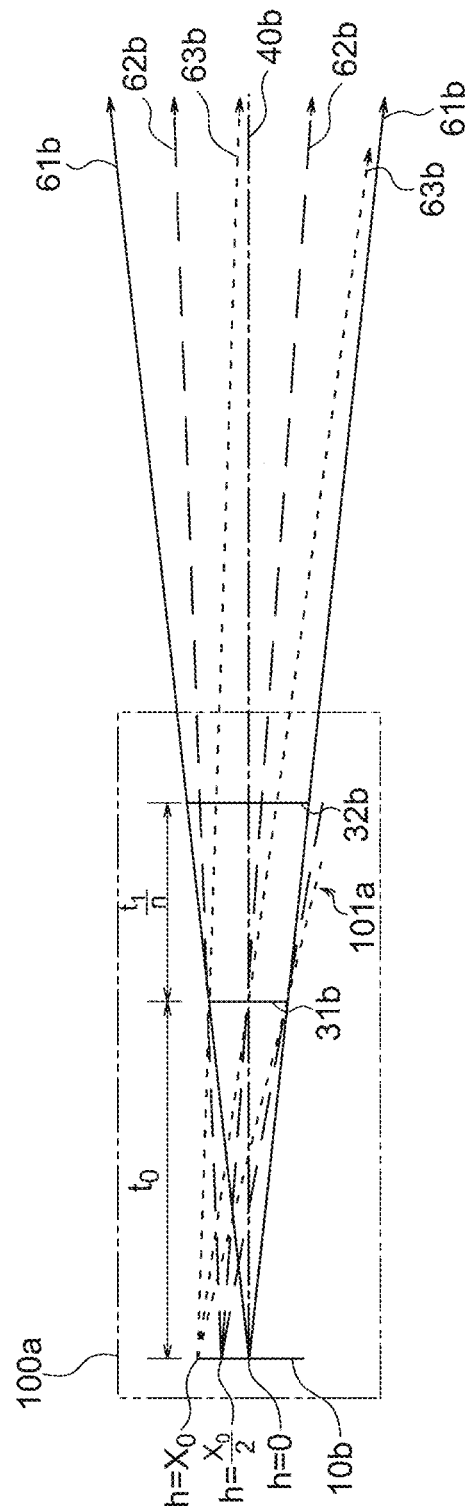
FIG. 10 is a diagram showing back light as imaginary light beams traveling from a light-receiving pixel in a +Z-axis direction, in the image reading device according to the first comparative example.

FIG. 10 is a diagram showing imaginary back light beams 61b through 63b traveling from the light-receiving pixel 10b in the +Z-axis direction, in the image reading device 100a according to the first comparative example. The back light beams 61b through 63b are back light beams traveling in the +Z-axis direction from an object surface that is a light receiving surface of the light-receiving pixel 10b. The back light beam 61b is a back light beam traveling in the +Z-axis direction from a point which is an object height h=0 on the object surface. The back light beam 62b is a back light beam traveling in the +Z-axis direction from a point which is an object height h=$X_0$/2 on the object surface. The back light 63b is a back light beam traveling in the +Z-axis direction from a point which is an object height h=$X_0$ on the object surface. In FIG. 10 and FIGS. 13, 16, and 20 described later, the first light-transmissive member 51 having the refractive index n and the thickness $t_1$ is replaced by a first light-transmissive member 51 having a refractive index 1 and a thickness $t_1/n$.

Figure 11:
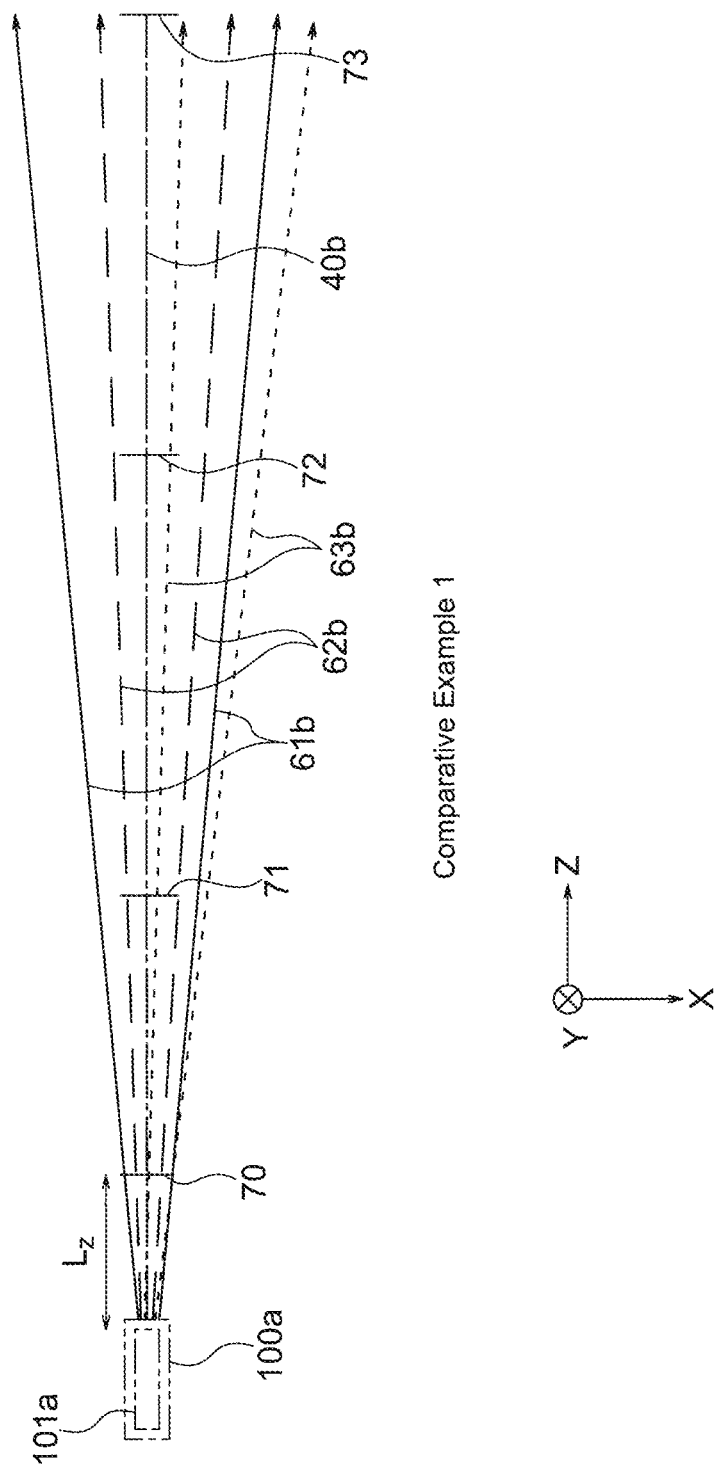
FIG. 11 is a diagram showing spread of back light illustrated in FIG. 10.

FIG. 11 is a diagram showing spread of the back light beams 61b through 63b illustrated in FIG. 10. In FIG. 11, to emphasize the spread of the back light beams 61b through 63b, the imaging optical unit 101a shown in FIG. 10 is downsized. In FIG. 11, targets 71 through 73 are placed at an interval (e.g., 2 mm) from the imaging optical unit 101a in the +Z-axis direction. In a case where all the back light beams pass through the targets 71 through 73, a sufficiently large depth of field is obtained. Here, in the case of acquiring an image with a resolution of 200 dpi, as a guide, when a light beam from a range of two pixels or less on a document reaches one light-receiving pixel in the imaging optical unit, a resolution of 200 dpi is obtained. The reason why a sufficient resolution is obtained even with spread of two pixels is that a light flux on the optical axis reaches the light-receiving pixel with a minimum loss and the amount of the light flux coming from visual field ends of the two pixels on the document and reaching the light-receiving pixel is small. In FIG. 11, each width of the targets 71 through 73 in the X-axis direction is a size corresponds to two pixels. In the example of the first embodiment, since the distance p in the X-axis direction between light-receiving pixels 10 adjacent to each other in the X-axis direction is 252 µm, the width of the targets 71 through 73 in the X-axis direction is 252 µm.

In FIG. 11, a position at which spread of the light flux of the back light beams 61b through 63b corresponds to two pixels on the document 6 (shown in FIG. 1) is denoted by 70. In the following description, in each of the image reading devices according to the first and second comparative examples and the first embodiment, a distance from the imaging optical unit to the position 70 is denoted by $L_z$. In the image reading device, the document placing table needs to be placed at the +Z-axis side of the imaging optical unit. As in the first embodiment, the illumination optical unit is disposed between the imaging optical unit and the document placing table in some cases. Thus, the depth of field necessary for acquiring an image with a resolution of 200 dpi is represented by a distance from the document placing table (the top panel glass 7 in FIG. 9) to the position 70. In the following description, the depth of field of the image reading devices according to the first and second comparative examples and the first embodiment is denoted by DOF.

As shown in FIGS. 10 and 11, in the first comparative example, the back light beams 61b through 63b continuously spread in the X-axis direction even after passing through the second opening 32b, and thus, the position 70 is located close to the imaging optical unit 101a, and the distance $L_z$ is small. In the first comparative example, the distance $L_z$ is, for example, about 0.5 mm. Thus, as shown in FIG. 9, if the top panel glass 7 having substantially the same thickness as the distance $L_z$ is disposed between the second opening 32b and the reference surface S, the depth of field DOF cannot be sufficiently large in the first comparative example. In the first comparative example, it is difficult to dispose the illumination optical unit 2 between the imaging optical unit 101a and the top panel glass 7.

Figure 12:
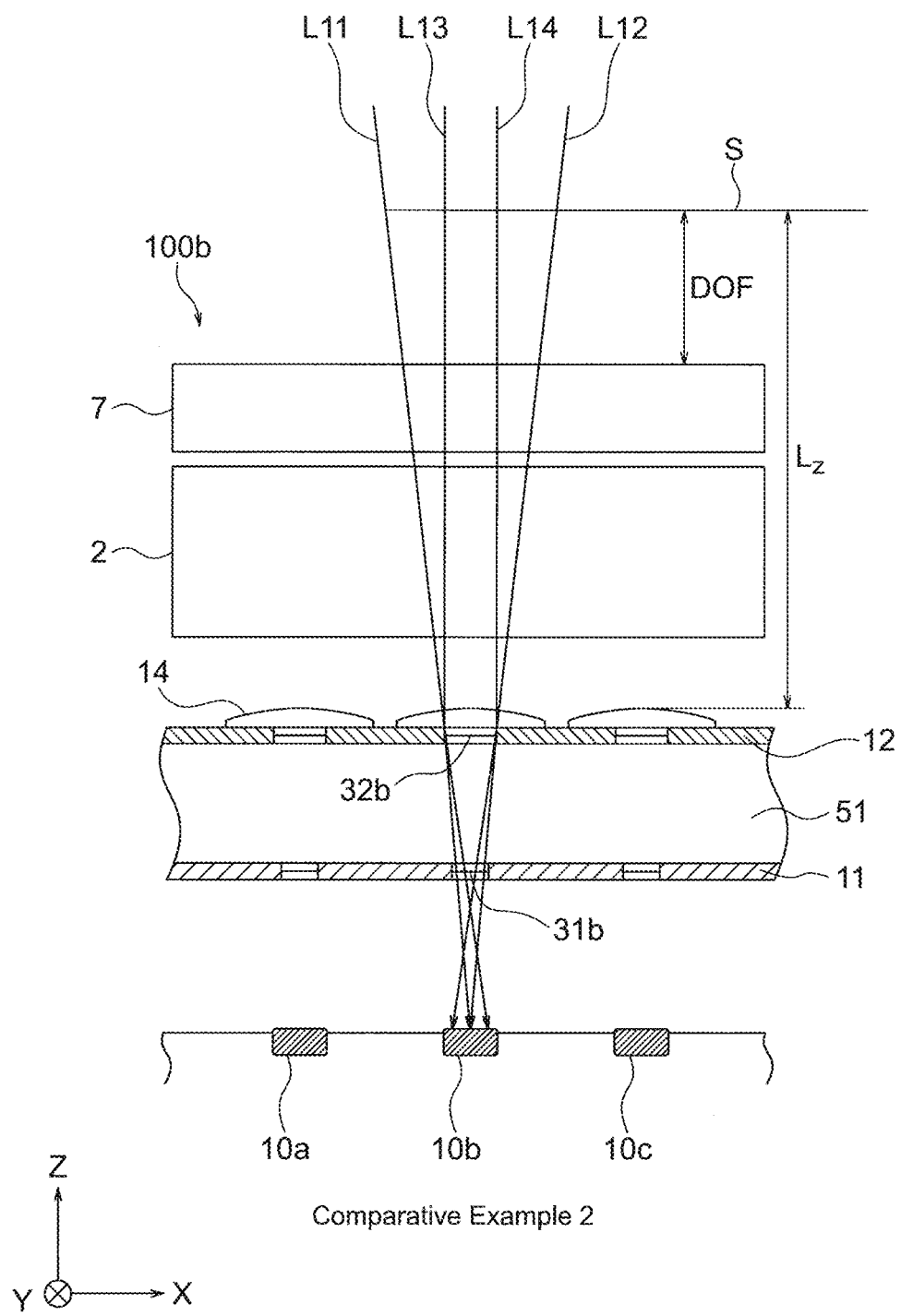
FIG. 12 is a diagram schematically showing reflected light entering a light-receiving pixel in an image reading device according to a second comparative example.

FIG. 12 is a diagram schematically showing reflected light entering the light-receiving pixel 10b in an image reading device 100b according to a second comparative example. The second comparative example is different from the image reading device 100 according to the first embodiment (shown in FIG. 15 described later) in including none of the third light-shielding member 13 and the second light-transmissive member 52 in the first embodiment. The second comparative example is also different from the image reading device 100 according to the first embodiment in disposing the condenser lenses 14 on the second light-shielding member 12.

Figure 13:
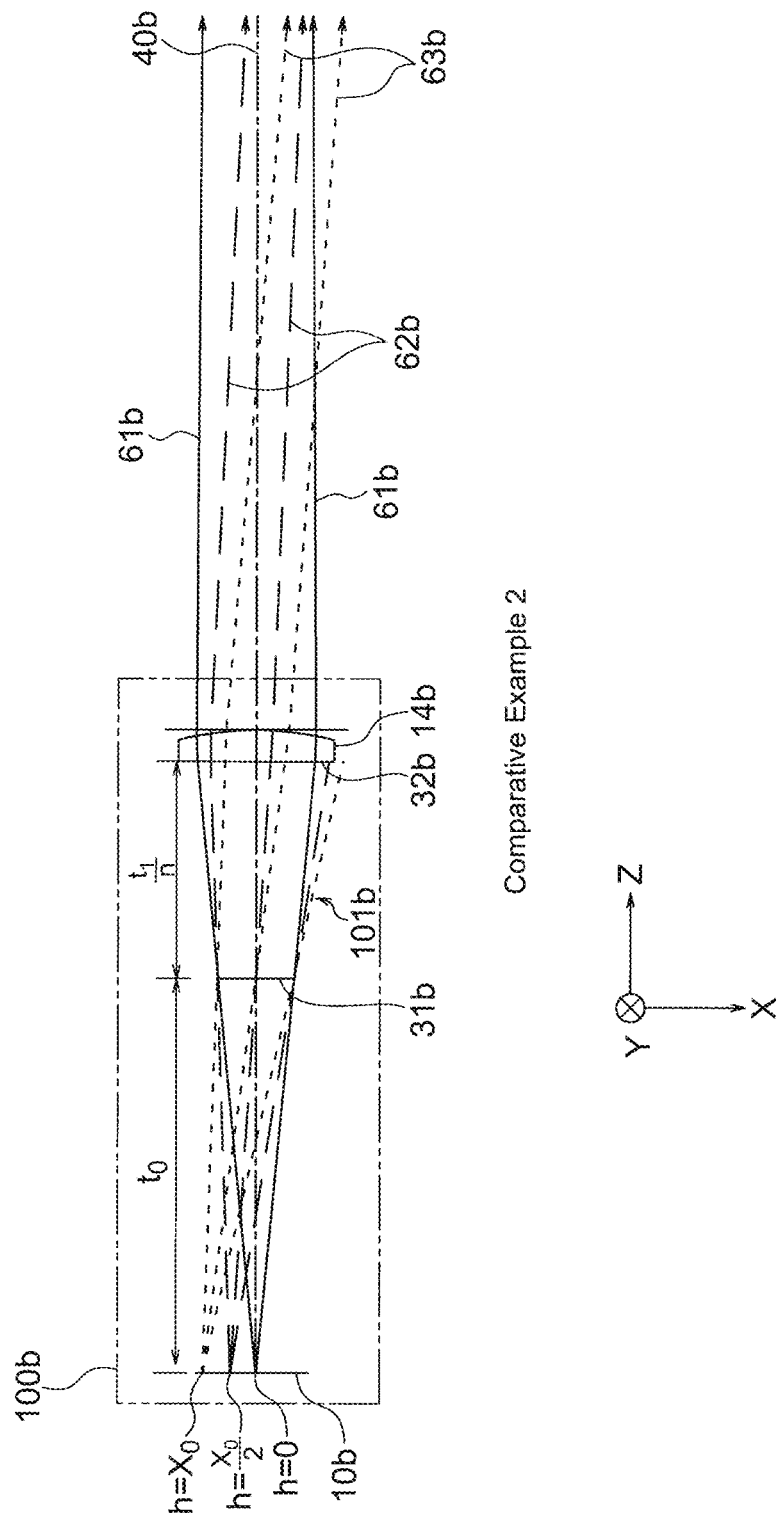
FIG. 13 is a diagram showing imaginary back light traveling from a light-receiving pixel in the +Z-axis direction, in the image reading device according to the second comparative example.

FIG. 13 is a diagram showing imaginary back light beams 61b through 63b traveling from the light-receiving pixel 10b in the +Z-axis direction, in the image reading device 100b according to the second comparative example. In the second comparative example, a focal length of the condenser lens 14b is set such that a point on the light-receiving pixel 10b comes into a focus on the target 73 in the targets 71 through 73 farthest from the imaging optical unit 101b in the +Z-axis direction. Here, the distance from the light-receiving pixel 10b to the condenser lens 14b is expressed by $t_0+t_1/n$.

For example, in the second comparative example, if $t_0$=0.25 mm, $t_1$=0.21 mm, and n=1.52, the distance from the light-receiving pixel 10b to the condenser lens 14b is 0.39 mm. In a case where the targets 71 through 73 are arranged at a distance of 2.0 mm from the imaging optical unit 101b, the distance from the imaging optical unit 101b to the target 73 is 6.0 mm. Thus, the distance from the light-receiving pixel 10b to the condenser lens 14b is considerably smaller than the distance from the imaging optical unit 101b to the target 73. Thus, the focal length of the condenser lens 14b is approximately 0.39 mm. At this time, as shown in FIG. 13, back light beams constituting the light flux of the back light beam 61b that has passed through the condenser lens 14b travel in parallel. Back light beams constituting the light flux of the back light beam 62b also travel in parallel after passing through the condenser lens 14b, and back light beams constituting the light flux of the back light 63b also travel in parallel after passing through the condenser lens 14b. The term "travel in parallel" herein includes "travel substantially in parallel".

Figure 14:
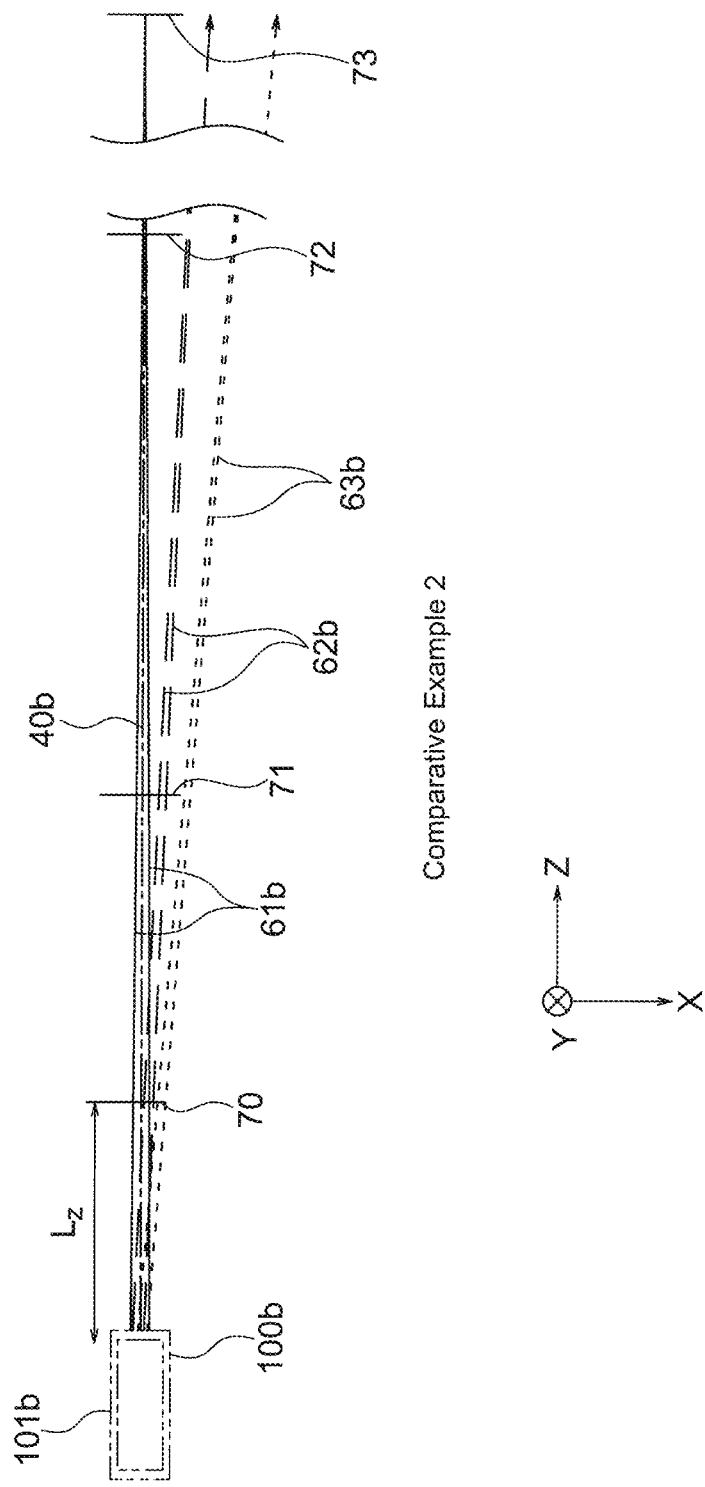
FIG. 14 is a diagram showing spread of the back light beams illustrated in FIG. 13.

FIG. 14 is a diagram showing spread of the back light beams 61b through 63b illustrated in FIG. 13. In FIG. 14, to emphasize spread of the back lights 61b through 63b, the imaging optical unit 101b shown in FIG. 13 is downsized. As shown in FIGS. 13 and 14, in the second comparative example, the light flux of the back light beam 61b, the light flux of the back light beam 62b, and the light flux of the back light 63b are focused by the condenser lens 14b. Accordingly, the position 70 moves away in the +Z-axis direction, and the distance $L_z$ is larger than that in the first comparative example. In the second comparative example, the distance $L_z$ is, for example, about 1.0 mm. However, as shown in FIG. 12, if the top panel glass 7 and the illumination optical unit 2 are disposed between the condenser lenses 14 and the reference surface S, the depth of field DOF is not sufficiently long, either, in the second comparative example.

Figure 15:
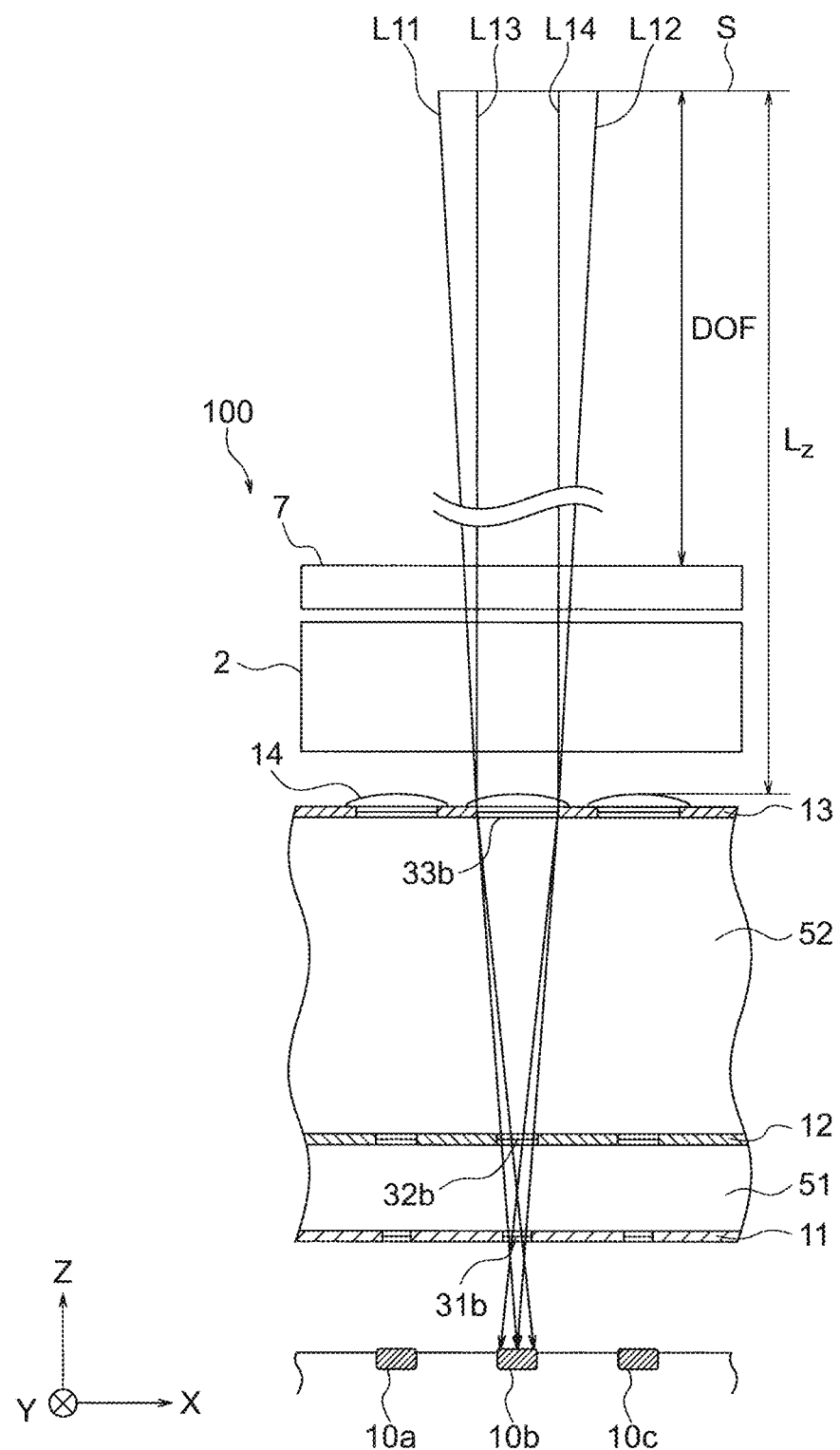
FIG. 15 is a diagram schematically showing reflected light entering the light-receiving pixel in the image reading device according to the first embodiment.

FIG. 15 is a diagram schematically showing reflected light entering the light-receiving pixel 10b in the image reading device 100 according to the first embodiment. As shown in FIG. 15, in the image reading device 100, the condenser lenses 14 are disposed at a distance from the second light-shielding member 12 in the +Z-axis direction. Specifically, the condenser lenses 14 are disposed at a sufficient distance from the second light-shielding member 12 with the second light-transmissive member 52 and the third light-shielding member 13 interposed therebetween.

FIG. 16 is a diagram showing the imaginary back light beams 61b through 63b traveling from the light-receiving pixel 10b in the +Z-axis direction, in the image reading device 100 according to the first embodiment. In FIG. 16 and FIG. 20 described later, the second light-transmissive member 52 having the refractive index n and the thickness $t_2$ is replaced by a second light-transmissive member 52 having a refractive index 1 and a thickness $t_2/n$, for convenience of description. As shown in FIG. 16, the condenser lens 14 is disposed at the distance $t_2/n$ from the second light-shielding member 12.

FIG. 17 is a diagram showing spread of the back light beams 61b through 63b illustrated in FIG. 16. In FIG. 17, to emphasize spread of the back lights 61b through 63b, the imaging optical unit 1 shown in FIG. 16 is downsized. In the image reading device 100, the focal length of the condenser lens 14b is set such that a point on the light-receiving pixel 10b comes into a focus at a point located between the target 71 and the target 72 (e.g., a point at a distance of 3.0 mm from the imaging optical unit 1 in the +Z-axis direction). As shown in FIGS. 16 and 17, main light beams of the light fluxes of the back light beams 61b through 63b that have passed through the condenser lens 14b are substantially in parallel in the Z-axis direction. Here, the main light beams are light beams passing through the center of the light flux. In addition, as shown in FIG. 17, in the image reading device 100, since the position 70 is farther than the position 70 in the second comparative example in the +Z-axis direction, the distance $L_z$ in the first embodiment is larger than the distance $L_z$ in the second comparative example. In the image reading device 100, the distance $L_z$ is, for example, about 3.5 mm. Accordingly, in the image reading device 100, even if the top panel glass 7 and the illumination optical unit 2 are disposed between the second opening 32b and the reference surface S, a sufficiently large depth of field DOF can be obtained. For example, in a case where a space of 1.5 mm is needed to dispose the top panel glass 7 and the illumination optical unit 2, a depth of field DOF of 2.0 mm can be obtained.

Thus, in the image reading device 100 according to the first embodiment, the condenser lens 14b is disposed at a distance from the second openings 32 so that the depth of field DOF of the image reading device 100 is larger than the depths of field DOF in the first and second comparative examples. In the image reading device 100, even in a case where the half width $X_0$ of the light-receiving pixels 10, the half opening width $X_1$ of the first openings 31, and the half opening width $X_2$ of the second openings 32 are increased, since the depth of field DOF can be increased, the increase in the depth of field DOF can be made with an increase in the amount of received light by the light-receiving pixels 10.

Lower Limit of Thickness of Second Light-Transmissive Member

A lower limit of the thickness $t_2$ of the second light-transmissive member 52 necessary for increasing the depth of field DOF will now be described. FIG. 18 is a diagram showing imaginary back light beams 61b and 63b from the light-receiving pixel 10b in the +Z-axis direction in the image reading device 100 in a case where one of the first and second openings 31 or 32 is an aperture stop. Reference numeral 30 in FIG. 18 denotes the aperture stop of the imaging optical unit 1. In other words, the aperture stop 30 is one of the first and second opening 31, 32. In FIG. 18, a distance from the light-receiving pixel 10b to the aperture stop 30 is denoted by $L_0$, and a distance from the aperture stop 30 to the third opening 33b is denoted by $L_1$.

Here, if the first opening 31 is the aperture stop 30, the distance $L_0$ and the distance $L_1$ are expressed by Equation (10) and Equation (11):

$$L_0 = t_0 \tag{10}$$

$$L_1 = t_1/n + t_2/n \tag{11}$$

If the second opening 32 is the aperture stop 30, the distance $L_0$ and the distance $L_1$ are expressed by Equation (12) and Equation (13):

$$L_0 = t_0 + t_1/n \tag{12}$$

$$L_1 = t_2/n \tag{13}$$

In FIG. 18, a back light beam passing through the center of the aperture stop 30 in the back light beam 61b traveling from the center of the light-receiving pixel 10b toward the aperture stop 30 is represented as a main light beam 64b. A back light beam passing through the center of the aperture stop 30 in the back light beam 63b traveling from an end portion of the light-receiving pixel 10b in the +X-axis direction toward the aperture stop 30 is represented as a main light beam 65b. If the main light beam 64b and the main light beam 65b are in parallel at the +Z axis side of the condenser lenses 14, the back light beams 61b and 63b is collected. The optical system in which the main light beam 64b and the main light beam 65b are in parallel is called a telecentric optical system. To achieve the telecentric optical system, it is necessary that a focal length f of the condenser lens 14b coincides with the distance $L_1$. That is, the telecentric optical system is achieved if Equation (14) below is satisfied:

$$f=L_1 \quad (14)$$

In FIG. 18, a plane including a point on which the back light beams 61b and 63b is collected and is parallel to the XY plane is denoted by 80, and the distance from the condenser lens 14b to the plane 80 is denoted by $L_2$. In FIG. 18, the distance from the imaging optical unit 1 (i.e., the condenser lens 14b) to the target 74 is denoted by $L_z$. The range in which the target 74 is irradiated with a light flux is substantially equal to the opening width of the third opening 33 in the X-axis direction. The opening width of the third opening 33 corresponds to a size of two pixels. The target 74 is located at a position at the distance $L_2$ from the plane 80 in the +Z-axis direction. To increase the depth of field DOF, the distance $L_z$ needs to be increased. As the distance $L_2$ increases, the distance $L_z$ increases. Here, from the lens formula, Equation (15) below is obtained:

$$1/(L_0+L_1)+1/L_2=1/f \quad (15)$$

From Equation (14) and Equation (15), with respect to the distance $L_2$, Equation (16) below is derived:

$$L_2=L_1 \cdot (L_0+L_1)/L_0 \quad (16)$$

Equation (16) shows that as the distance $L_1$ increases, the distance $L_2$ increases. To increase the distance $L_1$, it is necessary to increase the thickness $t_2$ of the second light-transmissive member 52 (shown in FIG. 3).

In view of this, the lower limit of the thickness $t_2$ of the second light-transmissive member 52 is considered. First, to increase the depth of field DOF, the distance $L_2$ needs to be larger than the sum of the distance $L_0$ and the distance $L_1$ as expressed by Equation (17):

$$L_2>L_0+L_1 \quad (17)$$

The sum of the distance $L_0$ and the distance $L_1$ is obtained from Equations (10) and (11) or Equations (12) and (13) by Equation (18):

$$L_0+L_1=t_0+(t_1/n)+(t_2/n) \quad (18)$$

In the example of the first embodiment, since $t_0$=0.25 mm, $t_1$=0.21 mm, $t_2$=0.70 mm, and n=1.52, if these values are substituted into Equation (18), the sum of the distance $L_0$ and the distance $L_1$ is 0.85 mm. Thus, to increase the depth of field DOF, the distance $L_2$ needs to be larger than 0.85 mm.

In FIG. 18, the distance $L_z$ is about twice as larger as the distance $L_2$. Since the lower limit of the distance $L_2$ is, for example, 0.85 mm, the lower limit of the distance $L_z$ is 1.7 mm in the example of first embodiment. To increase the depth of field DOF, the distance $L_z$ needs to be, for example, 1.7 mm or more.

Next, with reference to a relationship between the distance $L_1$ and the distance $L_0$, from Equation (16) and Equation (17), Equation (19) below is derived:

$$L_1>L_0 \quad (19)$$

Here, in the case where the first opening 31 is the aperture stop 30, if Equation (10) and Equation (11) are substituted into Equation (19), Equation (20) regarding the thickness $t_2$ of the second light-transmissive member 52 is derived:

$$t_2>n \cdot t_0-t_1 \quad (20)$$

In the case where the second opening 32 is the aperture stop 30, if Equation (12) and Equation (13) are substituted into Equation (19), Equation (21) regarding the thickness $t_2$ of the second light-transmissive member 52 is derived:

$$t_2>n \cdot t_0+t_1 \quad (21)$$

If the thickness $t_2$ of the second light-transmissive member satisfies Equation (21), the thickness $t_2$ also satisfies Equation (20), and thus, the lower limit of the thickness $t_2$ of the second light-transmissive member 52 necessary for increasing the depth of field DOF is $n \cdot t_0-t_1$ expressed by Equation (20). Thus, if the thickness $t_2$ of the second light-transmissive member 52 satisfies Equation (20), a sufficiently large depth of field DOF can be obtained.

Upper Limit of Thickness of Second Light-Transmissive Member

The upper limit of the thickness $t_2$ of the second light-transmissive member 52 will now be described in comparison with a comparative example. FIG. 19 is a diagram showing an imaginary back light beam 81b traveling from the light-receiving pixel 10b in the +Z-axis direction, in an image reading device 100c according to a third comparative example. The back light beam 81b is back light passing through a portion of the aperture stop 30b near an end of the aperture stop 30b in the −X-axis direction from an end portion of the light-receiving pixel 10b in the +X-axis direction, and passing through the third opening 33a.

The distance $L_1$ from the aperture stop 30b to the third opening 33b in the third comparative example is larger than the distance $L_1$ in the image reading device 100 shown in FIG. 18. Thus, the back light beam 81b does not pass through the third opening 33b located at a position different from the light-receiving pixel 10b but the third opening 33a located at a position not overlapping the light-receiving pixel 10b. The back light beam 81b becomes the back light beam 82b after passing through the third opening 33a and the condenser lens 14a. The distance between the back light beam 82b and the optical axis 40b in the X-axis direction increases with away from the condenser lens 14a in the +Z-axis direction. That is, in the third comparative example, an excessively large distance $L_1$ causes the presence of light beams passing through third openings except the third opening 33b at a different position from the light-receiving pixel 10b, and the imaging optical unit 1 acquires an image affected by stray light. The following description is directed to the upper limit of the distance $L_1$ necessary for preventing the back light beam 81b from passing through the third opening 33a adjacent to the third opening 33b overlapping the light-receiving pixel 10b and the upper limit of the thickness $t_2$ of the second light-transmissive member 52.

Next, in FIG. 19, a half opening width that is a width of ½ of the opening width of each of the third openings 33a and 33b in the X-axis direction is denoted by $X_3$. Since the distance between the center positions of the adjacent third openings 33a and 33b in the X-axis direction is p, the half opening width $X_3$ is smaller than ½ of the distance p. Thus, the relationship between the half opening width $X_3$ and the distance p is expressed by Equation (22):

$$X_3 \le p/2 \quad (22)$$

A half opening width that is a width of ½ of the opening width of the opening 30b in the X-axis direction is denoted by $X_4$. If the first opening 31 (shown in FIG. 1) is the aperture stop 30b, the half opening width $X_4$ is expressed by Equation (23):

$$X_4 = X_1 \quad (23)$$

If the second opening 32 (shown in FIG. 1) is the aperture stop 30b, the half opening width $X_4$ is expressed by Equation (24):

$$X_4 = X_2 \quad (24)$$

In FIG. 19, an angle formed by the back light beam 81b with respect to the optical axis 40b is denoted by $\theta_2$. In a case where the back light beam 81b traveling from an end portion of the light-receiving pixel 10b in the +X-axis direction toward an end portion of the aperture stop 30b in the −X-axis direction, the angle $\theta_2$ is expressed by Equation (25):

$$\tan \theta_2 = (X_0 + X_4)/L_0 \quad (25)$$

Here, supposing the distance between the point R4 in the third opening 33a where the back light beam 81b reaches and the optical axis 40b is A, the angle $\theta_2$ formed by the back light beam 81b with respect to the optical axis 40b is expressed by Equation (26) described below, which is different from Equation (25).

$$\tan \theta_2 = (X_0 + A)/(L_0 + L_1) \quad (26)$$

From Equation (26) and Equation (27), with respect to the distance A, Equation (27) is derived:

$$A = ((L_0 + L_1) \cdot (X_0 + X_4)/L_0) - X_0 \quad (27)$$

A condition for preventing the back light beam 81b from passing through the third opening 33a is expressed by Equation (28):

$$A < p - X_3 \quad (28)$$

From Equation (27) and Equation (28), Equation (29) regarding the upper limit of the distance $L_1$ is derived.

$$L_1 < L_0 \cdot (p - X_3 - X_4)/(X_0 + X_4) \quad (29)$$

Thus, if the distance $L_1$ satisfies Equation (29), the back light beam 81b does not pass through the third opening 33a adjacent to the third opening 33b overlapping the light-receiving pixel 10b. Next, the upper limit of the thickness $t_2$ of the second light-transmissive member 52 is obtained from Equation (29).

If the first opening 31 is the aperture stop 30, from Equations (10), (11), and (23) and Equation (29), Equation (30) regarding the thickness $t_2$ of the second light-transmissive member 52 is derived:

$$t_2 < (n \cdot t_0 \cdot (p - X_3 - X_1)/(X_0 + X_1)) - t_1 \quad (30)$$

Next, if the second opening 32 is the aperture stop 30, from Equations (12), (13), and (24) and Equation (29), Equation (31) regarding the thickness $t_2$ of the second light-transmissive member is derived:

$$t_2 < (n \cdot t_0 + t_1) \cdot (p - X_3 - X_2)/(X_0 + X_2) \quad (31)$$

FIG. 20 is a diagram showing an imaginary back light beam 81b traveling from the light-receiving pixel 10b in the +Z-axis direction in the image reading device 100 according to the first embodiment in the case where the first opening 31b is the aperture stop 30b (shown in FIG. 19). As shown in FIG. 20, the back light beam 81b traveling from an end portion of the light-receiving pixel 10b in the +X-axis direction toward the first opening 31b passes through the second opening 32b. The back light beam 81b that has passed through the second opening 32b reaches the third light-shielding member 13. Here, supposing a line extending from a point at which the back light beam 81b reaches the third light-shielding member 13 toward an imaginary line V is a line 83b, the line 83b intersects with the imaginary line V at the point $Q_1$. The imaginary line V is a line passing through an end portion of the third opening 33a in the +X-axis direction and parallel to the optical axes 40a and 40b. A point at which a line 84b connecting an end portion of the light-receiving pixel 10b in the +X-axis direction and an end portion of the second opening 32b in the −X-axis direction intersects with the imaginary line V is denoted by $Q_2$. The line 84b does not pass through the first opening 31b, and thus, a light beam traveling along the line 84b is blocked by the first light-shielding member 11.

Here, the distance from the point $Q_1$ to the second light-shielding member 12 corresponds to a value obtained by dividing the right side of Equation (30) by the refractive index n of the second light-transmissive member 52 (i.e., M1/n). The distance from the point $Q_2$ to the second light-shielding member 12 corresponds to a value obtained by dividing the right side of Equation (31) by the refractive index n (i.e., M2/n).

Here, M1 and M2 are individually expressed by Equation (32) and Equation (33):

$$M1 = (n \cdot t_0 \cdot (p - X_3 - X_1)/(X_0 + X_1)) - t_1 \quad (32)$$

$$M2 = (n \cdot t_0 + t_1) \cdot (p - X_3 - X_2)/(X_0 + X_2) \quad (33)$$

If the first opening 31 is the aperture stop 30, M1≥M2 is established. In FIG. 20, since the first opening 31 is the aperture stop 30, from Equation (30) and Equation (32), the thickness $t_2$ of the second light-transmissive member 52 is smaller than M1. Accordingly, there is no back light passing through the third opening 33a at a position not overlapping the light-receiving pixel 10b, and an image not affected by stray light can be acquired. In FIG. 20, since the point $Q_2$ is located at the −Z axis side of the third opening 33a, the thickness $t_2$ of the second light-transmissive member 52 is larger than M2. However, as described above, a light beam traveling along the line 84b is blocked by the first light-shielding member 11. Accordingly, if the first opening 31 is the aperture stop 30, the relationship between the thickness $t_2$ of the second light-transmissive member 52 and M2 is not taken into consideration, and it is necessary to satisfy the condition that the thickness $t_2$ of the second light-transmissive member 52 is smaller than M1.

If the second opening 32 is the aperture stop 30, M2≥M1 is established. In this case, if the thickness $t_2$ of the second light-transmissive member 52 is smaller than M2, there is no back light passing through the third opening 33a at a position not overlapping the light-receiving pixel 10b. As described above, the upper limit of the thickness $t_2$ of the second light-transmissive member 52 necessary for preventing back light from passing through the third opening 33a is obtained by Equation (34):

$$t_2 < \text{MAX}\{M1, M2\} \quad (34)$$

In the example of the first embodiment, since $t_0 = 250$ μm, $t_1 = 210$ μm, $n = 1.52$, $X_0 = 35.0$ μm, $X_1 = 27.0$ μm, $X_2 = 43.0$ μm, and $X_3 = 85.0$ μm, if these values are substituted into Equation (32) and Equation (33), M1=769 μm, and M2=1095 μm are obtained. Thus, from Equation (34), the upper limit of the thickness $t_2$ of the second light-transmissive member 52 is 1095 μm. In the example of the first embodiment, since the thickness $t_2$ of the second light-transmissive member 52 is 700 μm, Equation (34) is satisfied.

As described above, to increase the depth of field, the focal length f of the condenser lenses 14 needs to coincide with the distance $L_1$. However, as described above, the value of the distance $L_1$ varies depending on which one of the first openings 31 or the second openings 32 is the aperture stop 30. Thus, the focal length f of the condenser lenses 14 needs to satisfy the condition represented by Equation (35):

$$t_2/n \le f \le (t_1/n) + t_2/n \qquad (35)$$

Even if Equation (35) is satisfied, spread of back light is large is some cases. Thus, it is necessary to determine the position of a preferable focus F of the condenser lens 14 in order to reduce spread of back light.

Focus Position of Condenser Lens

A position of the focus F of the condenser lens 14 necessary for reducing spread of back light will now be described by using a tracking result of back light. FIG. 21A is a diagram showing imaginary back light beams traveling from the light-receiving pixel 10b in the +Z-axis direction, in an image reading device 100d according to a fourth comparative example. In the fourth comparative example, the position of the focus F of the condenser lens 14b in the Z-axis direction overlaps the position of the light-receiving pixel 10b in the Z-axis direction. As shown in FIG. 21A, in the fourth comparative example, the distance $L_z$ from the condenser lenses 14 to the plane 80 is small, and the depth of field is small.

FIG. 21B is a diagram showing imaginary back light beams traveling from the light-receiving pixel 10b in the +Z-axis direction, in an image reading device 100e according to a fifth comparative example. In the fifth comparative example, the position of a focus F of the condenser lens 14b in the Z-axis direction overlaps the position of the second opening 32b in the Z-axis direction. In the fifth comparative example, a light condensing power of the condenser lens 14b is high, and the position at which back light comes into a focus is close to the condenser lens 14b. Accordingly, in the fifth comparative example, spread of back light that has passed through the plane 80 is large, and thus, the distance $L_z$ is small, and as in the fourth comparative example, the depth of field is small.

FIG. 22A is a diagram showing the imaginary back light traveling from the light-receiving pixel 10b in the +Z-axis direction, in the image reading device 100 according to the first embodiment. In the image reading device 100, the position of the focus F of the condenser lens 14b in the Z-axis direction is located between the light-receiving pixel 10b and the first opening 31b. FIG. 22B is a diagram showing imaginary back light traveling from the light-receiving pixel 10b in a +Z-axis direction, in an image reading device 110 according to a variation of the first embodiment. In the image reading device 110, the position of the focus F of the condenser lens 14b in the Z-axis direction overlaps the position of the first opening 31b in the Z-axis direction.

The value of distance $L_z$ shown in FIG. 22B is substantially equal to the value of the distance $L_z$ shown in FIG. 22A. In the image reading devices 100 and 110, as compared to the fourth and fifth comparative examples, the distances $L_z$ are large, and the depths of field can be increased.

From FIGS. 21A and 21B and FIGS. 22A and 22B, when the position of the focus F of the condenser lens 14b is set between the light-receiving pixel 10b corresponding to the condenser lens 14b and the second opening 32b corresponding to the light-receiving pixel 10b, spread of back light can be reduced, and the depth of field of the image reading device 100 can be increased. A region between the light-receiving pixel 10b and the second opening 32b is a region sandwiched between the surface of the second light-shielding member 12 toward the −Z-axis direction and the surface of the light-receiving pixels 10 toward the +Z-axis direction shown in FIG. 2.

Third Light-Shielding Member

Next, with reference to FIGS. 1, 2, 3, and 16, the third light-shielding member 13 of the image reading device 100 according to the first embodiment will be described. As shown in FIG. 1, the third light-shielding member 13 includes circular third openings 33. The opening width (i.e., diameter) of each of the third openings 33 is smaller than an effective diameter of each of the condenser lenses 14. Thus, a back light beam 66b shown in FIG. 16 reaches the third light-shielding member 13. That is, since the image reading device 100 includes the third light-shielding member 13, scattered light generated on the document 6 is blocked by the third light-shielding member 13, and thus, scattered light does not reach the light-receiving pixel 10b. Accordingly, in the image reading device 100, degradation of contrast of an image or generation of a ghost image is prevented, and thus, the image reading device 100 is capable of reading an image with a high quality.

The diameter Φ of the third opening 33b shown in FIG. 16 is larger than the width of light flux of each of the back light beams 61b through 63b in the X-axis direction. Accordingly, all the back light beams 61b through 63b pass through the third opening 33b. Thus, as shown in FIGS. 2 and 3, in the configuration in which the third light-shielding member 13 including the third openings 33 and the condenser lenses 14 are disposed between the second openings 32 and the reference surface S, a decrease in the amount of light received by the light-receiving pixels 10 is small.

Advantages of First Embodiment

As described above, in the image reading device 100 according to the first embodiment, the condenser lenses 14 are disposed at a distance from the second openings 32. Thus, even in the case where the width of the light-receiving pixels 10 in the X-axis direction and the opening areas of the first and second openings 31 and 32 are increased in order to increase the amount of light received by the light-receiving pixels 10, the depth of field can be increased.

In addition, in the image reading device 100 according to the first embodiment, since the focus F of the condenser lens 14 is located between the light-receiving pixels 10 and the second openings 32, the depth of field can be further increased.

In the image reading device 100 according to the first embodiment, the thickness $t_2$ of the second light-transmissive member 52 satisfies Equation (20) so that the depth of field can be further increased.

In the image reading device 100 according to the first embodiment, the thickness $t_1$ of the first light-transmissive member 51 satisfies Equation (4), reflected light beams that have passed through the second openings 32 and the first openings 31 corresponding to the light-receiving pixels 10 enter the light-receiving pixels 10, and thus, an image not affected by stray light can be acquired.

In the image reading device 100 according to the first embodiment, the thickness $t_1$ of the first light-transmissive member 51 satisfies Equation (9) so that reflected light beams that have passed through the second openings 32 and the first openings 31 corresponding to the light-receiving pixels 10 enter the light-receiving pixels 10, and thus, an image not affected by stray light can be acquired.

In addition, in the image reading device 100 according to the first embodiment, the thickness $t_2$ of the second light-transmissive member 52 satisfies Equation (34) so that reflected light beams that have passed through the third opening, second openings 32 and the first openings 31 corresponding to the light-receiving pixels 10 enter the light-receiving pixels 10, and thus, an image not affected by stray light can be acquired.

Variation of First Embodiment

FIG. 23 is a diagram showing imaginary back light beams L15 through L18 traveling from the light-receiving pixel 10b in the +Z-axis direction, in an image reading device 120 according to a variation of the first embodiment. The image reading device 120 is different from the image reading device 100 in arrangement positions of the condenser lenses 14a through 14c. Specifically, in the image reading device 120, center positions 94 of the condenser lenses 14a through 14c are shifted in the +X-axis direction from center positions 90 of the light-receiving pixels 10a through 10c. As shown in FIG. 23, in the image reading device 120, back light beams L15 through L17 pass through the condenser lens 14b, and then are tilted in the +X-axis direction. This tilt, however, does not affect image performance such as resolution. The back light beam L18 is a back light traveling from an end portion of the light-receiving pixel 10b in the +X-axis direction toward the third light-shielding member 13 through the second opening 32b. The back light beam L18 includes a back light beam L18a blocked by the third light-shielding member 13, and a back light beam L18b passing through the condenser lens 14a if the image reading device 120 is assumed not to include the third light-shielding member 13. The back light beam L18b travels in a direction different from the back light beams L15 through L17 (i.e., a direction tilted in the −X-axis direction).

In FIG. 23, however, since the image reading device 120 includes the third light-shielding member 13, the back light beam L18a is blocked by the third light-shielding portion 43. Here, a difference between the diameter of the third openings 33a through 33c and the effective diameter of the condenser lenses 14a through 14c is an allowable error of arrangement positions of the condenser lenses 14a through 14c. In the image reading device 120, the diameter of the third openings 33a through 33c is smaller than the effective diameter of the condenser lenses 14a through 14c. Thus, even when the arrangement positions of the condenser lenses 14a through 14c to the light-receiving pixels 10a through 10c are shifted, an image not affected by stray light can be acquired.

FIG. 24 is a perspective view showing an imaging optical unit 1a of an image reading device 130 according to a variation of the first embodiment of the present invention. FIG. 25 is a diagram schematically showing reflected light entering light-receiving pixels 10 in the image reading device 130 shown in FIG. 24. The same reference characters as those in FIG. 1 designate the same or corresponding components as those shown in FIG. 1, and description thereof will be omitted. The image reading device 130 is different from the image reading device 100 according to the first embodiment in arrangement positions of the condenser lenses 14.

As shown in FIGS. 24 and 25, in the image reading device 130, the third light-transmissive member 53 is disposed between the second light-transmissive member 52 and the condenser lenses 14. The third light-transmissive member 53 is, for example, a transparent glass member. The third light-transmissive member does not need to be completely transparent and may be translucent.

The third light-transmissive member 53 is fixed to the third light-shielding member 13 by bonding with, for example, an adhesive. The condenser lenses 14 are disposed on the third light-transmissive member 53. The condenser lenses 14 are formed on a surface 53a of the third light-transmissive member 53 facing the reference surface S (shown in FIG. 1). Since the condenser lenses 14 are formed on the surface 53a of the third light-transmissive member 53, the step of forming the condenser lenses 14 and the step of positioning the condenser lenses 14 and the third openings 33 are separate steps, and thus, accuracy in positioning the condenser lenses 14 and the third openings 33 can be enhanced.

In the image reading device 130, no light-shielding member is present between the third light-transmissive member 53 and the condenser lenses 14. Thus, stray light occurs unless light beams L11 and L12 passing through both ends of the third openings 33 in light beams passing through the third openings 33 are included within the range of the opening diameter of the condenser lenses 14.

Here, the light beams L11 and L12 are light beams whose spread in the X-axis direction gradually increases as the distance from the third openings 33 in the +Z-axis direction increases. Thus, as a thickness t3 of the third light-transmissive member 53 increases, spread of back light of the light beams L11 and L12 increases. In view of this, in the image reading device 130, since the thickness t3 of the third light-transmissive member 53 is sufficiently thin, the light beams L11 and L12 are included within the range of effective diameter of the condenser lens 14a. Thus, in the image reading device 130, an image not affected by stray light can be acquired. The thickness t3 of the third light-transmissive member 53 is smaller than the thickness $t_2$ of the second light-transmissive member 52, and is, for example, 210 µm. Since the light beams L11 and L12 are included within the range of effective diameter of the condenser lenses 14, not only the configuration in which the thickness t3 of the third light-transmissive member 53 is reduced but also a configuration in which the opening width of the third openings 33 is reduced may be employed.

Regarding the other aspects, the image reading device 130 according to the variation of the first embodiment is the same as the image reading device 100 according to the first embodiment.

Second Embodiment

FIG. 26 is a perspective view schematically showing a configuration of an imaging optical unit 201 of an image reading device 200 according to a second embodiment. In FIG. 26, the same reference characters as those in FIG. 1 designate the same or corresponding components as those shown in FIG. 1. The image reading device 200 is different from the image reading device 100 according to the first embodiment in further including a fourth light-shielding member 15.

As shown in FIG. 26, in the imaging optical unit 201 of the image reading device 200, the fourth light-shielding member 15 is disposed between the first light-shielding member 11 and the second light-shielding member 12. The fourth light-shielding member 15 includes a plurality of fourth openings 35. The plurality of fourth openings 35 are arranged to correspond to the plurality of first openings 31 respectively and correspond to the plurality of second openings 32 respectively. The plurality of fourth openings 35 are arranged in two lines. The plurality of fourth openings 35 are arranged in the X-axis direction. The plurality of fourth openings 35 are arranged in a staggered pattern. When seen in the Z-axis direction, the plurality of fourth openings 35 overlap the plurality of first openings 31 respectively and overlap the plurality of second openings 32 respectively. In the image reading device 200, reflected light that has passed through the third openings 33 sequentially passes through the second openings 32, the fourth openings 35, and the first openings 31 in this order, and enters the light-receiving pixels 10.

The first light-transmissive member 251 is formed by bonding a plurality of (two in this example) glass boards 251a and 251b together with, for example, an adhesive. A first light-shielding member 11 is provided on a surface of the glass board 251a facing the light-receiving pixels 10, and a second light-shielding member 12 is provided on a surface of the glass board 251b facing the condenser lenses 14. The fourth light-shielding member 15 is provided between the glass boards 251a and 251b. The fourth light-shielding member 15 may be formed on any one of the surface of the glass board 251a facing the condenser lenses 14 or the surface of the glass board 251b facing the light-receiving pixels 10.

In the first embodiment in which the first light-transmissive member 51 is constituted by one glass board, to suppress occurrence of stray light, the thickness $t_1$ of the first light-transmissive member 51 needs to satisfy the conditions expressed by Equation (4) and Equation (9). On the other hand, in the second embodiment, since the fourth light-shielding member 15 is disposed between the first light-shielding member 11 and the second light-shielding member 12 and the first light-transmissive member 251 is constituted by the glass boards 251a and 251b, the thickness $t_1$ of the first light-transmissive member 51 does not need to satisfy the conditions expressed by Equation (4) and Equation (9).

A plurality of light-shielding members may be disposed between the first light-shielding member 11 and the second light-shielding member 12. That is, the first light-transmissive member 251 may be constituted by three or more glass boards and another light-shielding member may be provided between adjacent glass boards.

Regarding the other aspects, the image reading device 200 according to the second embodiment is the same as the image reading device 100 according to the first embodiment.

The image reading device 200 according to the second embodiment can obtain advantages same as those of the image reading device 100 according to the first embodiment.

In the image reading device 200 according to the second embodiment, since the fourth light-shielding member 15 is disposed between the first light-shielding member 11 and the second light-shielding member 12, even when the distance between openings adjacent to each other in the X-axis direction is reduced, reflected light that has passed through the second openings 32, the fourth openings 35, and the first openings 31 corresponding to the light-receiving pixels 10 enters the light-receiving pixels 10. As a result, in the image reading device 200 according to the second embodiment, an image with a high resolution can be acquired.

Third Embodiment

FIG. 27 is a perspective view schematically showing a configuration of an imaging optical unit 301 of an image reading device 300 according to a third embodiment of the present invention. In FIG. 27, the same reference characters as those in FIG. 1 designate the same or corresponding components as those shown in FIG. 1. The image reading device 300 is different from the image reading device 100 according to the first embodiment in arrangement of light-receiving pixels and arrangement of openings.

As shown in FIG. 27, in the imaging optical unit 301 of the image reading device 300, a plurality of light-receiving pixels 310 are arranged in a line. A plurality of first openings 331 are arranged in a line. A plurality of second openings 332 are arranged in a line. A plurality of third openings 333 are arranged in a line. A plurality of condenser lenses 314 are arranged in a line. Accordingly, a fabrication process of the image reading device 300 can be eased.

In the third embodiment, to acquire an image with a resolution of 200 dpi, an arrangement pitch p (i.e., distance between adjacent light-receiving pixels 310) of the light-receiving pixels 310 needs to be set at 126 μm, which is ½ of an arrangement pitch (i.e., distance between adjacent light-receiving pixels 10) in the first embodiment. Here, in the third embodiment, a thickness $t_1$ of a first light-transmissive member 351 necessary for acquiring an image not affected by stray light is considered. If the half width $X_0$=31.5 μm of the light-receiving pixels 310, the refractive index n=1.52 of the first light-transmissive member 51, the half opening width $X_1$=20.0 μm of the first openings 331, the half opening width $X_2$=20.0 μm of the second openings 332, and the distance $t_0$=100 μm from the light-receiving pixels 310 to the first openings 331 are substituted into Equation (4) and Equation (9) described in the first embodiment, Equation (36) is derived:

$$93.6 \; \mu m \leq t_1 \leq 98.4 \; \mu m \tag{36}$$

Thus, in the image reading device 300 according to the third embodiment, to acquire an image not affected by stray light, the thickness $t_1$ of the first light-transmissive member 351 needs to satisfy Equation (36).

In the third embodiment, to acquire an image with a resolution of 100 dpi, it is necessary that the half width $X_0$ of light-receiving pixels 310 is 31.5 μm, the refractive index n of the first light-transmissive member 351 is 1.52, the half opening width $X_1$ of the first openings 331 is 24.0 μm, the half opening width $X_2$ of the second openings 332 is 38.0 μm, the half opening width $X_3$ of the third openings 333 is 850 μm, the distance $t_0$ from the light-receiving pixels 310 to the first openings 331 is 250 μm, and the thickness $t_2$ of the second light-transmissive member 52 is 700 μm.

Regarding aspects except for those described above, the image reading device 300 according to the third embodiment is the same as the image reading device 100 according to the first embodiment.

The image reading device 300 according to the third embodiment can obtain advantages same as those of the image reading device 100 according to the first embodiment.

Accordingly, in the image reading device 300 according to the third embodiment, a fabrication process of the image reading device 300 can be eased.

Fourth Embodiment

FIG. 28 is a perspective view schematically showing a configuration of an imaging optical unit 401 of an image reading device 400 according to a fourth embodiment of the present invention. In FIG. 28, the same reference characters as those in FIG. 1 designate the same or corresponding components as those shown in FIG. 1. The image reading device 400 is different from the image reading device 100 according to the first embodiment in arrangement of the light-receiving pixels, arrangement of the first opening, arrangement of the second opening, arrangement of the third opening, and arrangement of the condenser lenses. Accordingly, the document 6 does not need to be conveyed, and two-dimensional image information can be acquired from the stationary document 6.

As shown in FIG. 28, in the imaging optical unit 401 of the image reading device 400, a plurality of light-receiving pixels 410 are arranged in a matrix, that is, in columns and rows. A plurality of first openings 431 are arranged in a matrix. A plurality of second openings 432 are arranged in a matrix. A plurality of third openings 433 are arranged in a matrix. A plurality of condenser lenses 414 are arranged in a matrix.

Regarding aspects except for those described above, the image reading device 400 according to the fourth embodiment is the same as the image reading device 100 according to the first embodiment.

The image reading device 400 according to the fourth embodiment can obtain advantages same as those of the image reading device 100 according to the first embodiment.

In the image reading device 400 according to the fourth embodiment, the document 6 does not need to be conveyed, and two-dimensional image information can be acquired from the stationary document 6.

INDUSTRIAL APPLICABILITY

The image reading devices according to the first through fourth embodiments are applicable to copying machines, bill readers, and so forth.

DESCRIPTION OF REFERENCE CHARACTERS 6 document, 10, 310, 410 light-receiving pixel, 11 first light-shielding member, 12 second light-shielding member, 13 third light-shielding member, 14, 14a, 314, 414 condenser lens, 15 fourth light-shielding member, 31, 331, 431 first opening, 32, 332, 432 second opening, 33, 333, 433 third opening, 35 fourth opening, 51, 251, 351 first light-transmissive member, 52 second light-transmissive member, 53 third light-transmissive member, 100, 110, 120, 130, 200, 300, 400 image reading device, F focus, S reference surface.

What is claimed is:

1. An image reading device comprising:
a plurality of light-receiving pixels arranged in a predetermined arrangement direction and configured to receive light reflected on an imaging object, the imaging object being placed on a predetermined reference surface;
a first light-shielding member including a plurality of first openings and disposed between the plurality of light-receiving pixels and the reference surface;
a second light-shielding member including a plurality of second openings and disposed between the plurality of first openings and the reference surface;
a plurality of condenser lenses disposed between the plurality of second openings and the reference surface and disposed at a distance from the plurality of second openings;
a first light-transmissive member disposed between the first light-shielding member and the second light-shielding member; and
a second light-transmissive member disposed between the second light-shielding member and the plurality of condenser lenses, wherein
the plurality of first openings are arranged to correspond to the plurality of light-receiving pixels respectively,
the plurality of second openings are arranged to correspond to the plurality of light-receiving pixels respectively,
the plurality of condenser lenses are arranged to correspond to the plurality of light-receiving pixels respectively,
the plurality of condenser lenses, the second light-shielding member, the first light-shielding member, and the plurality of light-receiving pixels are arranged at positions at which the reflected light entering each light-receiving pixel of the plurality of light-receiving pixels sequentially passes through one of the plurality of condenser lenses corresponding to the each light-receiving pixel, one of the plurality of second openings corresponding to the each light-receiving pixel, and one of the plurality of first openings corresponding to the each light-receiving pixel and enters the each light-receiving pixel, and $$t_2 > n \cdot t_0 - t_1$$

where $t_0$ denotes a distance between the plurality of light-receiving pixels and the first light-shielding member, $t_1$ denotes a thickness of the first light-transmissive member, $t_2$ denotes a thickness of the second light-transmissive member, and n denotes a refractive index of each of the first light-transmissive member and the second light-transmissive member.

2. The image reading device according to claim 1, further comprising a third light-transmissive member disposed between the second light-transmissive member and the plurality of condenser lenses,
wherein the plurality of condenser lenses are disposed on the third light-transmissive member.

3. The image reading device according to claim 1, further comprising a third light-shielding member including a plurality of third openings and disposed between the second light-shielding member and the plurality of condenser lenses,
wherein the plurality of third openings are arranged to correspond to the plurality of light-receiving pixels respectively.

4. The image reading device according to claim 3, wherein
the plurality of condenser lenses are disposed on the third light-shielding member, and
an opening width of each of the plurality of third openings is smaller than an effective diameter of each of the plurality of condenser lenses.

5. The image reading device according to claim 3, wherein $$t_2 < \mathrm{MAX}\{M1, M2\}$$

where $X_0$ denotes a width of ½ of a width of each of the plurality of light-receiving pixels in the arrangement direction, $X_1$ denotes a width of ½ of an opening width of each of the plurality of first openings in the arrangement direction, $X_2$ denotes a width of ½ of an opening width of each of the plurality of second openings in the arrangement direction, $X_3$ denotes a width of ½ of an opening width of each of the plurality of third openings in the arrangement direction, and p denotes a distance between center positions of each two of the plurality of light-receiving pixels adjacent to each other in the arrangement direction, $$M1=(n \cdot t_0 \cdot (p-X_3-X_1)/(X_0+X_1))-t_1, \text{ and}$$

$$M2=(n \cdot t_0+t_1) \cdot (p-X_3-X_2)/(X_0+X_2).$$

6. The image reading device according to claim 3, wherein the plurality of light-receiving pixels are arranged in a staggered pattern.

7. The image reading device according to claim 3, wherein the plurality of light-receiving pixels are arranged in a line.

8. The image reading device according to claim 3, wherein the plurality of light-receiving pixels are arranged in a matrix.

9. The image reading device according to claim 1, wherein a thickness $t_1$ of the first light-transmissive member satisfies $$t_1 < \sqrt{n^2-1} \cdot (p-X_1-X_2)$$

where $X_1$ denotes a width of ½ of an opening width of each of the plurality of first openings in the arrangement direction, $X_2$ denotes a width of ½ of an opening width of each of the plurality of second openings in the arrangement direction, and p denotes a distance between center positions of each two of the plurality of light-receiving pixels adjacent to each other in the arrangement direction.

10. The image reading device according to claim 9, wherein a thickness $t_1$ of the first light-transmissive member satisfies $$t_1 > (X_1 + X_2) \cdot \sqrt{n^2 - 1 + \frac{n^2 \cdot t_0^2}{(p - X_1 - X_0)^2}}$$

where $X_0$ denotes a width of ½ of a width of each of the plurality of light-receiving pixels in the arrangement direction.

11. The image reading device according to claim 1, further comprising a fourth light-shielding member including a plurality of fourth openings and disposed between the first light-shielding member and the second light-shielding member, wherein the plurality of fourth openings are arranged to correspond to the plurality of first openings respectively and correspond to the plurality of second openings respectively.

12. An image reading device comprising:

a plurality of light-receiving pixels arranged in a predetermined arrangement direction and configured to receive light reflected on an imaging object, the imaging object being placed on a predetermined reference surface;

a first light-shielding member including a plurality of first openings and disposed between the plurality of light-receiving pixels and the reference surface;

a second light-shielding member including a plurality of second openings and disposed between the plurality of first openings and the reference surface;

a third light-shielding member disposed between the second light-shielding member and the plurality of condenser lenses;

a plurality of condenser lenses disposed between the plurality of second openings and the reference surface and disposed at a distance from the plurality of second openings;

a first light-transmissive member disposed between the first light-shielding member and the second light-shielding member; and a second light-transmissive member disposed between the second light-shielding member and the plurality of condenser lenses, wherein the plurality of first openings are arranged to correspond to the plurality of light-receiving pixels respectively, the plurality of second openings are arranged to correspond to the plurality of light-receiving pixels respectively, the plurality of condenser lenses are arranged to correspond to the plurality of light-receiving pixels respectively, the plurality of third openings are arranged to correspond to the plurality of light-receiving pixels respectively, the plurality of condenser lenses, the second light-shielding member, the first light-shielding member, and the plurality of light-receiving pixels are arranged at positions at which the reflected light entering each light-receiving pixel of the plurality of light-receiving pixels sequentially passes through one of the plurality of condenser lenses corresponding to the each light-receiving pixel, one of the plurality of second openings corresponding to the each light-receiving pixel, and one of the plurality of first openings corresponding to the each light-receiving pixel and enters the each light-receiving pixel, and $$t_2 < \text{MAX}\{M1, M2\}$$

where $t_0$ denotes a distance between the plurality of light-receiving pixels, $t_1$ denotes a thickness of the first light-transmissive member, $t_2$ denotes a thickness of the second light-transmissive member, n denotes a refractive index of each of the first light-transmissive member and the second light-transmissive member, $X_0$ denotes a width of ½ of a width of each of the plurality of light-receiving pixels in the arrangement direction, $X_1$ denotes a width of ½ of an opening width of each of the plurality of first openings in the arrangement direction, $X_2$ denotes a width of ½ of an opening width of each of the plurality of second openings in the arrangement direction, $X_3$ denotes a width of ½ of an opening width of each of the plurality of third openings in the arrangement direction, and p denotes a distance between center positions of each two of the plurality of light-receiving pixels adjacent to each other in the arrangement direction, $$M1=(n \cdot t_0 \cdot (p-X_3-X_1)/(X_0+X_1))-t_1, \text{ and}$$

$$M2=(n \cdot t_0+t_1) \cdot (p-X_3-X_2)/(X_0+X_2).$$

* * * * *